(12) United States Patent
Shimano et al.

(10) Patent No.: US 7,626,883 B2
(45) Date of Patent: Dec. 1, 2009

(54) SEMICONDUCTOR MEMORY DEVICE

(75) Inventors: Hiroki Shimano, Tokyo (JP); Kazutami Arimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 18 days.

(21) Appl. No.: 12/149,549

(22) Filed: May 5, 2008

(65) Prior Publication Data

US 2008/0279017 A1 Nov. 13, 2008

(30) Foreign Application Priority Data

May 10, 2007 (JP) ............... 2007-125773

(51) Int. Cl.
*G11C 5/14* (2006.01)
(52) U.S. Cl. ............. 365/226; 365/189.09; 365/210.12; 365/185.13; 365/185; 365/24
(58) Field of Classification Search ............... 326/226, 326/189.09, 210.12, 185.13, 185.24
See application file for complete search history.

(56) References Cited

U.S. PATENT DOCUMENTS

| | | | | |
|---|---|---|---|---|
| 5,091,888 A | * | 2/1992 | Akaogi | ............... 365/185.21 |
| 5,818,764 A | * | 10/1998 | Yiu et al. | ............... 365/185.11 |
| 6,525,984 B2 | * | 2/2003 | Yamagata et al. | ........... 365/226 |

FOREIGN PATENT DOCUMENTS

| | | |
|---|---|---|
| JP | 2000-173263 | 6/2000 |
| JP | 2005-353244 | 12/2005 |

OTHER PUBLICATIONS

Watanabe, Naoya et al., "An Embedded DRAM Hybrid Macro with Auto Signal Management and Enhanced-on-Chip Tester," IEICE Trans. Electron., vol. E86-C, No. 4 Apr. 2003.

* cited by examiner

*Primary Examiner*—Anh Phung
*Assistant Examiner*—Tha-O Bui
(74) *Attorney, Agent, or Firm*—McDermott Will & Emery LLP

(57) ABSTRACT

During a stand-by state in which power supply is cut off, a high-voltage power supply control circuit isolates a global negative voltage line transmitting a negative voltage and a local negative voltage line provided corresponding to each respective sub array block from each other and isolates a global ground line and a local ground line transmitting a ground voltage from each other. These local ground line and local negative voltage line are charged to a high voltage level through a high voltage line before cut-off from the corresponding power supply. A leakage current path from a word line to the negative voltage line or the ground line is cut off, so that the word line in a non-selected state can reliably be maintained at a non-selection voltage. Thus, in a low power consumption stand-by mode, data stored in a memory cell can be held in a stable manner.

8 Claims, 27 Drawing Sheets

SEMICONDUCTOR MEMORY DEVICE

BACKGROUND OF THE INVENTION

1. Field of the Invention

The present invention relates to a semiconductor memory device, and particularly to an embedded memory integrated on a single semiconductor chip together with a processing device such as a logic. More specifically, the present invention relates to a configuration for reducing current consumption without deteriorating data hold characteristic of a memory cell in a deep power down mode (low current consumption stand-by mode) of an embedded DRAM (dynamic random access memory).

2. Description of the Background Art

In the fields of image data processing and the like, in order to perform high-speed data processing, a system LSI (large scale integrated circuit) in which a logic circuit such as a processor and a memory circuit are integrated on a single semiconductor chip has widely been used. In the system LSI, as the logic circuit and the memory circuit are interconnected via on-chip interconnects, the following advantageous effects are obtained:

(1) a load of a signal interconnection line is lower than that of an on-board interconnection line and data or a signal can be transmitted at high speed;

(2) as the number of pin terminals is not restricted, a data bus width can be greater and a bandwidth for data transfer can be greater;

(3) as each component is integrated on the single semiconductor chip, a small and compact system can be implemented; and (4) a macro prepared as library can be arranged for a component to be formed on the semiconductor chip and design efficiency can be improved.

For these reasons, the system LSI is widely and commonly used in various fields as an SOC (system on chip) and the like.

In addition, examples of the memory circuit used in the system LSI cover, in addition to the DRAM, an SRAM (static random access memory), a flash memory (non-volatile semiconductor memory device), and the like. Further, examples of the logic circuit cover a processor for control and data processing, an analog processing circuit such as an A/D (analog/digital) conversion circuit, and a logic circuit dedicated to logic processing.

In the DRAM of an example of the memory circuit, a memory cell includes a capacitor and stores data in accordance with an amount of electric charges stored in the capacitor. In order to prevent loss of electric charges stored in the memory cell capacitor due to a leakage current or the like, a so-called refresh operation is required. The configuration of the memory cell, however, is relatively simple, and a memory with a small occupation area and a large storage capacity can be implemented. Therefore, the DRAM will increasingly be indispensable as the embedded memory in the system LSI of which amount of information processing increases.

The configuration of the DRAM used for such embedded memory is disclosed, for example, in Non Patent Document 1 (N. Watanabe et al., "An Embedded DRAM Hybrid Macro with Auto Signal Management and Enhanced-on-Chip Tester," IEICE Trans. Electron., Vol. E86-C, No. 4, April 2003, pp. 624-632).

According to Non Patent Document 1, a memory cell array, an array control driver, a power supply circuit, a data path (a data input and output portion), a clock generator, and an internal operation timing generator are each prepared as macro, and a main control circuit and a local control circuit can be synthesized with software in accordance with applications/specifications. In addition, Non Patent Document 1 discloses a configuration for performing refresh in a bank basis as refresh operation control, with a memory cell array being divided into a plurality of banks.

When such embedded DRAM is applied to applications such as portable equipment, low power consumption is required. In the DRAM, however, electric charges stored in the memory cell capacitor are lost due to various types of leakage currents such as a junction leakage current at a storage node (connection node between the memory cell capacitor and an access transistor), a channel leakage current of a memory cell transistor (access transistor), a gate leakage current of a capacitor insulating film, and the like. Accordingly, refresh should be repeated at predetermined intervals such that refresh of all rows in the memory cell array is completed once in a refresh time period (tREF) determined by the memory cell with the worst data hold characteristic (shortest data holding time period) in the memory cell array.

In the refresh operation, a word line arranged corresponding to a memory cell row is driven to a selected state and storage data in the memory cells are read on corresponding bit line pairs. Thereafter, the storage data in the memory cell read on the bit line pair is amplified by an associated sense amplifier and the amplified data is written back again into the original memory cell. Therefore, as signal lines are charged and discharged and circuitry in a portion related to row selection operates, consumption of AC (alternating current)-wise current increases. In addition, with the increase in the storage capacity and shrinking in feature size, consumption of DC (direct current)-wise current due to an off-leakage current of the transistor in an internal circuit of the embedded DRAM also increases. Therefore, such AC current and DC current flow in a stand-by mode in which data is simply held and external data access is not carried out, and current consumption for data hold is an innegligible amount.

A configuration for reducing such current consumption in a stand-by mode is disclosed, for example, in Patent Document 1 (Japanese Patent Laying-Open No. 2005-353244). In Patent Document 1, the access transistor is configured with a P-channel MOS transistor (insulated gate type field effect transistor). In order to suppress loss of electric charges stored in the memory cell capacitor due to the off-leakage current of the access transistor, a word line voltage is varied between a high voltage VPP higher than a cell power supply voltage and a negative voltage VBB. When a word line is in a non-selected state (including a stand-by state), a word line voltage is at a high voltage VPP level, and when a word line is in a selected state, the word line voltage is set to negative voltage VBB.

Patent Document 1 considers such a problem in the word line drive scheme described above that, when a word line is selected, electric charges for charging the word line flow to a negative power supply node and negative voltage VBB becomes unstable, and accordingly current consumption in a negative voltage generation circuit becomes large. Specifically, in Patent Document 1, when a word line is selected, the word line is first coupled to a ground node and a voltage of the selected word line is transitioned to a ground voltage level. Thereafter, the selected word line is driven to the negative voltage level. The current that flows into the negative voltage generation circuit upon selection of the word line is reduced to a current comparable to a current flowing between the ground voltage and the negative voltage, thereby reducing noise on the negative voltage upon selection of the word line. In addition, current consumption in the negative voltage generation circuit is thus reduced.

Normally, the DRAM supports a power down mode in order to reduce power consumption in the stand-by mode. In the power down mode, supply of a power supply voltage to a circuit not related to the refresh operation (such as a column selection circuit and an input and output circuit) is stopped. In this case, however, power is constantly supplied to circuitry related to the refresh operation (a word line selection circuit and a sense amplifier circuit).

A configuration for further reducing current consumption in such power down mode is disclosed, for example, in Patent Document 2 (Japanese Patent Laying-Open No. 2000-173263). In the configuration disclosed in Patent Document 2, a word line is formed into a hierarchical word line structure including main and sub word lines. The access transistor in the memory cell is formed of an N-channel transistor. During non-selected state or stand-by, a main word line is maintained at H level (logical high level) and a sub word line is maintained at L level (logical low level). High voltage VPP and a ground voltage VSS are supplied to a word line driver as an operating power supply voltage. The word line driver is configured with inverters of two stages. A latch transistor latching an input portion voltage in accordance with an output voltage of an inverter in the first stage is provided at the input portion of the inverter in the first stage. A high-side power supply line (high voltage line) and a low-side power supply line (ground line) of these inverters of two stages are arranged in a hierarchical structure. During the stand-by cycle, in accordance with output voltage levels of these inverters, power supply to one of these operating power supply voltages is stopped. Specifically, as the inverter at the first stage outputs a signal at L level during stand-by, supply of the high-side power supply voltage is stopped. As a drive inverter in the next stage outputs H level (high voltage level) during stand-by, supply of the low-side power supply voltage is stopped. Thus, in a stand-by cycle, leakage current that flows from the high voltage node to the ground node through a transistor in an OFF state is suppressed.

In a portable terminal such as a portable phone, as a battery is used as the power supply, current consumption is required to be reduced as possible extent. In order to further reduce current consumption in the stand-by mode, a deep power down mode is employed. In the deep power down mode, supply of the power supply voltage and the internal voltage to the embedded DRAM is stopped. In performing refresh, necessary power supply voltage and internal voltage are supplied so as to perform refresh. Therefore, supply of the power supply voltage and the internal voltage is stopped in the stand-by cycle and no leakage current flowing path exists.

As disclosed in aforementioned Patent Document 1, however, when a P-channel MOS transistor is used as the memory cell transistor, the word line voltage should be maintained at the high voltage level during the stand-by state in the deep power down mode. This is because, when the word line voltage is lowered, the access transistor is rendered conductive, electric charges stored in the capacitor flow away, and data stored in the memory cell is lost.

Non Patent Document 1 described previously merely discloses a macro configuration of a general embedded DRAM and does not consider current consumption in the stand-by mode nor an operation in the power down mode or the deep power down mode.

Patent Document 1 merely considers instability of a word line selection voltage (negative voltage) in selecting a word line and current consumption in a selection voltage (negative voltage) generation portion. Patent Document 1 does not consider a configuration for reducing current consumption in the stand-by mode such as the power down mode or the deep power down mode.

According to Patent Document 2, the leakage current path in the word line driver is cut off in the power down mode. In the power down mode, however, the high voltage is constantly supplied to the word line driver that serves as the circuit related to refresh. Patent Document 2 does not consider a configuration for cutting off supply of the power supply voltage and the internal voltage even to the circuit related to refresh, as in the deep power down mode. In addition, the word line driver is merely supplied with the high voltage and the ground voltage. Patent Document 2 does not consider a configuration for suppressing lowering in the high voltage in the stand-by mode, in a driver configuration in which three kinds of voltages of high voltage, ground voltage and negative voltage are supplied.

In addition, in the configuration according to Patent Document 2, the memory cell transistor is configured with the N-channel transistor. Normally, a sub word line driver provided for a sub word line drives the sub word line in accordance with a voltage of a corresponding main word line. The sub word line driver receives a sub decode signal at an operating power supply node. The sub decode signal is set to L level in the stand-by state. Therefore, even when the voltage of the main word line lowers due to the leakage current and a gate potential in the transistor of the sub word line driver lowers during the stand-by cycle, the potential of the sub word line is not raised. In the configuration according to Patent Document 2, even if the voltage of the main word line lowers during the stand-by cycle, the access transistor in the memory cell is set to a shallow ON state and it is less likely that data stored in the memory cell is lost. Patent Document 2 does not consider the data hold characteristic of the memory cell in the deep power down mode in which supply of the power supply voltage and the internal voltage is stopped.

SUMMARY OF THE INVENTION

An object of the present invention is to provide a semiconductor memory device capable of reducing current consumption in a low current consumption stand-by mode such as a deep power down mode, without deteriorating data hold characteristics of a memory cell.

Another object of the present invention is to provide a semiconductor memory device suitable for mount together with a logic, capable of reducing power consumption in a stand-by mode.

In summary, a semiconductor memory device according to the present invention includes circuitry for suppressing voltage lowering on a voltage line transmitting a voltage to a word line during a stand-by state in a deep power down mode in which supply of an internal voltage is stopped, and hence suppresses lowering in a gate voltage of a memory cell transistor.

In one embodiment, the semiconductor memory device according to the present invention includes a plurality of sub blocks and a power supply circuit generating at least first and second voltages and stopping generation of the first and second voltages during a stand-by state in a stand-by mode in which data is held. Each of the plurality of sub arrays has a plurality of memory cells arranged in rows and columns. Each memory cell requires refresh of storage data. In the stand-by mode, the power supply circuit stops generation of the first and second voltages during the stand-by state subsequent to completion of burst refresh successively performed on a plurality of memory cells for holding data.

The semiconductor memory device according to the one embodiment further includes a first global voltage line commonly transmitting the first voltage from the power supply circuit to the plurality of sub blocks, a second global voltage line commonly transmitting the second voltage from the power supply circuit to the plurality of sub blocks, a plurality of first and second local voltage lines arranged corresponding to the sub blocks respectively, and a plurality of voltage setting circuits arranged corresponding to the sub blocks respectively.

Each of the first local voltage lines is coupled to the first global voltage line and transmits the voltage from the global voltage line into the corresponding sub block. The voltage setting circuit sets a voltage of the second local voltage line arranged in the corresponding sub block to a voltage level on the second global voltage line selectively in accordance with a sub block selection signal.

In the one embodiment of the present invention, a global reference voltage line commonly transmitting a fixed voltage to the plurality of sub blocks and a plurality of local reference voltage lines arranged corresponding to the sub blocks respectively are further provided. Each sub block includes a sub array, and word lines are arranged corresponding to memory cell rows in the sub array. Each word line is connected to the memory cells in a corresponding row.

A word line drive control circuit is provided corresponding to each sub array. The word line drive control circuit includes a plurality of word line drivers provided corresponding to the respective word lines. Each word line driver includes a pre-drive stage at the first stage and a drive stage driving the corresponding word line. The pre-drive stage generates a signal varying between a voltage on the corresponding local reference voltage line and a first voltage on the first local voltage line in accordance with the row selection signal. The drive stage transmits to the corresponding word line, one of the voltage on the first local voltage line and the voltage on the second local voltage line in accordance with an output signal from the pre-drive stage.

During the stand-by state, at least the global reference voltage line and the local reference voltage line are isolated from each other, and voltage lowering in the first local voltage line due to the leakage current is suppressed. Such power supply control is carried out by a drive power supply control circuit.

During the stand-by state, voltage level lowering in the first local voltage line for maintaining the word line in a non-selected state is suppressed. Therefore, even if supply of the internal voltage and the power supply voltage is stopped in the stand-by mode and the first global voltage line is effectively set to an electrically floating state, voltage lowering can be suppressed and the word line can be maintained at the non-selection voltage level. Accordingly, loss of the data stored in the memory cell can be prevented, it is not necessary to shorten a refresh time period, and current consumption can be reduced by utilizing the deep power down mode as the stand-by mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Overall Configuration]

Figure 1:
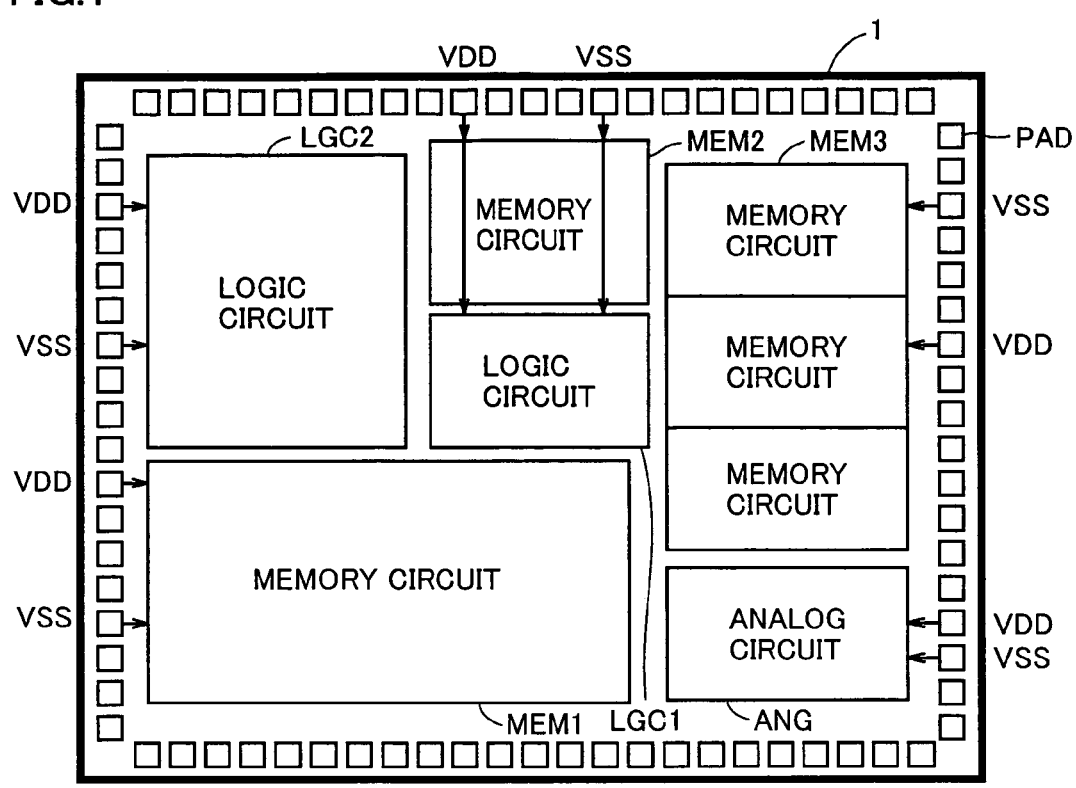
FIG. 1 schematically shows an overall configuration of a system LSI to which the present invention is applied.

FIG. 1 schematically shows an overall configuration of a system LSI to which a semiconductor memory device according to the present invention is applied. In FIG. 1, in a system LSI 1, logic circuits LGC1 and LGC2 such as a processor, memory circuits MEM1 to MEM3, and an analog circuit ANG are integrated on a single semiconductor chip. Memory circuits MEM1 to MEM3 are configured, for example, into a DRAM, an SRAM, and a non-volatile RAM. A plurality of pads PADs are arranged around the periphery of the semiconductor chip, and each circuit block is individually supplied with a high-side power supply voltage VDD and a low-side power supply voltage GND. By individually supplying the high-side and low-side power supply voltages to each circuit block, an operation of each circuit block is stabilized.

Where this system LSI 1 is implemented as a controller for an LCD (liquid crystal display device), analog circuit ANG includes an A/D conversion circuit converting analog image data from a camera into digital image data.

Memory circuit MEM1 is a memory of a large storage capacity, and stores image data converted to digital data. Memory circuit MEM1 is configured, for example, with a DRAM of a large storage capacity. Memory circuit MEM2 is configured, for example, with an SRAM, and used as a working area for performing processing for interpolating pixel data, or the like. Memory circuit MEM3 is configured with a non-volatile RAM such as a flash memory, and used as an area for holding a picked-up image.

Logic circuit LGC2 carries out display of an image on a not-shown liquid crystal display device by using these memory circuits MEM1 to MEM3.

Where system LSI 1 is applied to portable equipment, a battery is used for the power supply. In portable equipment such as a portable phone, a stand-by time period is long. Therefore, from a point of view of battery life, it is required that current consumption is reduced as much as possible even in such a stand-by state. In the present embodiment, an embedded DRAM is provided which realizes a low stand-by current dissipation while holding data, comparable to that in an SRAM. A configuration of a DRAM integrated as memory circuit MEM1 will be described hereinafter.

First Embodiment

Figure 2:
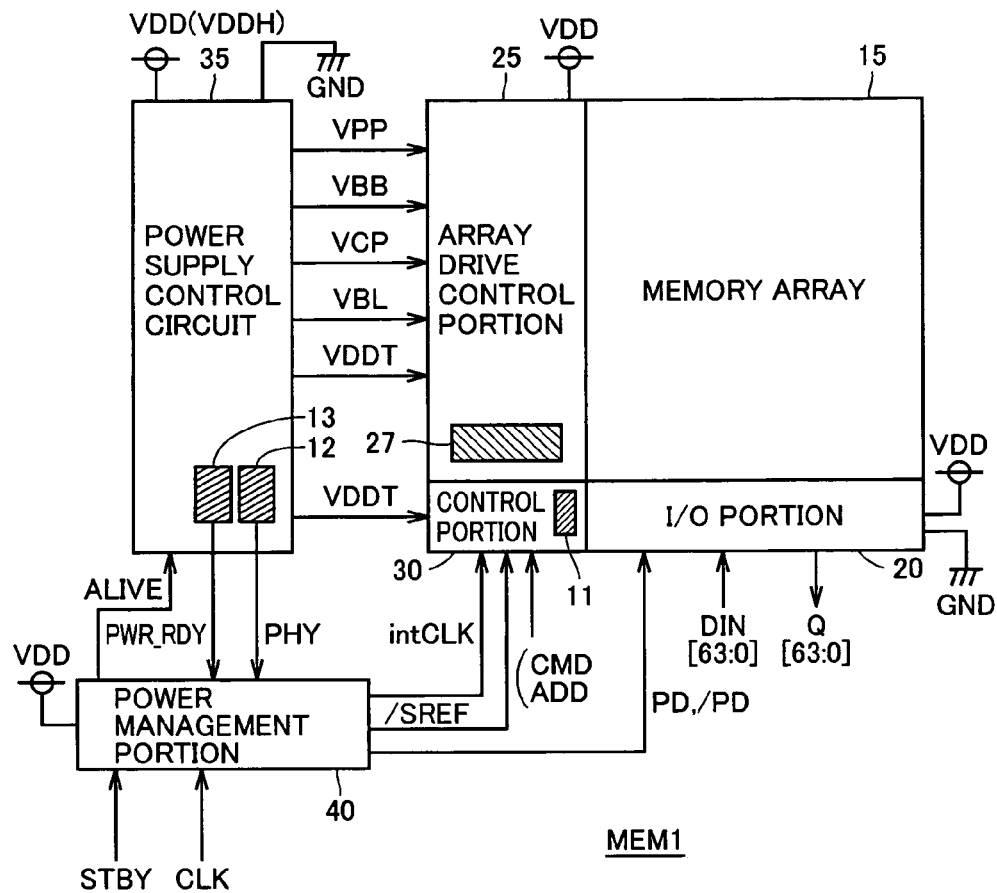
FIG. 2 schematically shows an overall configuration of a semiconductor memory device according to the present invention.

FIG. 2 schematically shows an overall configuration of memory circuit MEM1 according to the first embodiment of the present invention. In FIG. 2, memory circuit MEM1 includes a memory array 15 having a plurality of memory cells arranged in rows and columns, an I/O portion (input and output portion: data path) 20 transmitting and receiving data to and from memory array 15, and an array drive control portion 25 driving the memory cell in memory array 15 to a selected/non-selected state.

More specific configuration of memory cell array 15 and array drive control portion 25 will be described later. Here, a drive power supply control portion 27 provided in array drive control portion 25 is representatively shown. Most circuits in drive power supply control portion 27 receive a power supply voltage VDDT supplied from a power supply control circuit 35 as an operating power supply voltage, however, some circuits receive an external power supply voltage VDD to carry out control for maintaining the memory cells in memory array 15 in the non-selected state during the stand-by state in the deep power down mode.

I/O portion 20 directly receives high-side power supply voltage VDD and low-side power supply voltage GND as the operating power supply voltages from an outside. Where input/output data for memory array 15 is data of 64 bits, I/O portion 20 transmits and receives 64-bit output data Q [63:0] and input data DIN [63:0] to and from an external logic (logic circuit LGC2 or LGC1 shown in FIG. 1).

In addition, I/O portion 20 receives control signals (power down instruction signal) PD, /PD outputted from a power management portion 40. In response to these power down instruction signals PD and /PD, supply of external power supply voltages VDD and GND to I/O portion 20 is controlled.

Memory circuit MEM1 further includes a control portion 30 controlling an operation of memory array 15, array drive control portion 25 and I/O portion 20, and a power supply control circuit 35 supplying an operating power supply voltage and an internal voltage to array drive control portion 25 and control portion 30.

Although control portion 30 includes a circuit for generating control signals controlling data write/read into/from memory array 15, FIG. 2 representatively shows a refresh address counter 11 for generating a refresh address when storage data in the memory cell included in memory array 15 is to be refreshed. In the refresh operation, control portion 30 supplies an instruction to array drive control portion 25 to perform the refresh operation in synchronization with an internal clock signal intCLK from power management portion 40, in response to a refresh instruction signal /SREF outputted from power management portion 40.

In a normal operation mode in which external data access is made, control portion 30 controls operations of array drive control portion 25 and I/O portion 20 in synchronization with internal clock signal intCLK, in accordance with a command CMD and an address ADD, to cause these portions to perform the operation designated by command CMD. In addition, I/O portion 20 performs write and read of the data in a selected memory cell in the memory array under the control of control portion 30.

Receiving external high-side power supply voltage VDD and low-side power supply voltage GND, power supply control circuit 35 supplies internal voltages VPP, VBB, VCP, VBL, and VDDT to memory array 15, array drive control portion 25 and control portion 30, in accordance with an instruction from power management portion 40 which will be described later. Here, it is shown that a voltage as high as high-side power supply voltage VDD supplied to I/O portion 20 is supplied to power supply control circuit 35 as the high-side power supply voltage. Alternative to high-side power supply voltage VDD, a power supply voltage VDDH higher than power supply voltage VDD may be supplied.

Power management portion 40 is provided as a peripheral circuit, for example, in the logic circuit or the like, in order to manage power supply in memory circuit MEM1. Therefore, in memory circuit MEM1, circuit portions except for power management portion 40, that is, memory array 15, array drive control portion 25, I/O portion 20, control portion 30, and power supply control circuit 35, are arranged, within the system LSI, as the DRAM macro (hereinafter, referred to as a DRAM core as appropriate).

It is not particularly required that power management portion 40 is provided within a logic circuit (logic circuit LGC2) determining operation timing of the entire system LSI. Power management portion 40 is only needed to be arranged at a periphery of a DRAM core, on the common semiconductor chip together with the DRAM core.

Power management portion 40 controls power supply to I/O portion 20 and power supply control circuit 35 in accordance with a stand-by mode instruction signal STBY and a clock signal CLK, supplies internal clock signal intCLK to control portion 30, and outputs refresh instruction signal /SREF instructing the refresh operation of memory array 15. In addition, power management portion 40 internally counts supplied clock signal CLK while stand-by mode instruction signal STBY is asserted, and outputs refresh instruction signal /SREF at predetermined timings based on a predetermined refresh time period set in advance.

Power management portion 40 further asserts power down instruction signals PD and /PD in response to assertion of stand-by mode instruction signal STBY and provides these power down instruction signals to I/O portion 20.

Although the configuration will be described in detail later, power supply control circuit 35 controls supply of each internal power supply voltage and high-side power supply voltage VDD to a circuit portion for generating an internal voltage, in response to a control signal (wake-up signal) ALIVE (/ALIVE) applied from power management portion 40.

In addition to the circuits generating various internal voltages, power supply control circuit 35 further includes a clock generation circuit 12 for issuing a refresh clock PHY defining frequency of the refresh operation and a level detection circuit 13 for sensing whether the internal power supply voltage attains to a predetermined voltage level.

Refresh clock generation circuit 12 continuously generates refresh clocks PHY in the stand-by mode of the DRAM core (deep power down mode). Refresh clock PHY defines a cycle in which the refresh operation is to be performed. In response to this refresh clock PHY, a row-related circuit related to row selection included in array drive control portion 25 operates in the DRAM core (memory circuit MEM1) and refresh of storage data in the memory cells are performed.

Level detection circuit 13 detects a level of internal power supply voltage VDDT and asserts a power supply ready signal PWR_RDY when the level is not lower than a predetermined voltage level. In response to this power supply ready signal PWR_RDY, a low current consumption stand-by mode (deep power down mode; reference simply to the stand-by mode hereinafter indicates the deep power down mode unless otherwise specified).

While refresh mode instruction signal /SREF is asserted, refresh address counter 11 included in control portion 30 updates the refresh address in synchronization with internal clock signal intCLK supplied from power management portion 40 and provides the resultant refresh address to array drive control portion 25. Based on this refresh address, the memory cell to be refreshed is designated.

When this refresh is carried out, array drive control portion 25 performs the refresh operation of the memory cells at the corresponding address in memory array 15, based on the refresh address supplied from refresh address counter 11 included in control portion 30.

In each embodiment hereinafter, the stand-by mode in which data is simply held without input and output of external data will be described. Detailed description of a general operation in external data write and external data read is not provided.

Figure 3:
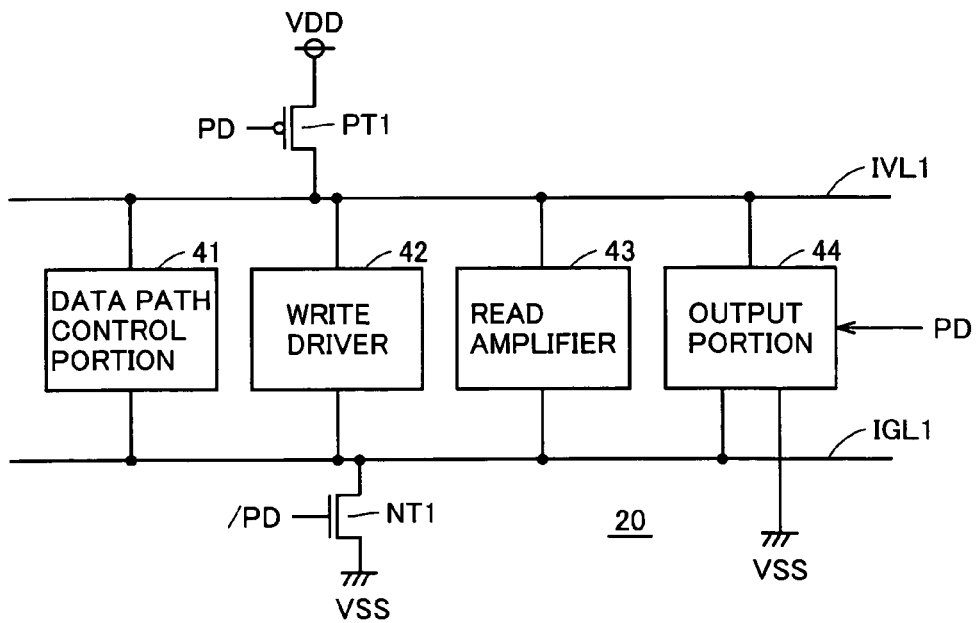
FIG. 3 schematically shows a configuration of an I/O portion shown in FIG. 2.

FIG. 3 schematically shows a configuration of I/O portion (data path) 20 shown in FIG. 2. In FIG. 3, I/O portion 20 includes a data line control portion 41 for controlling precharge, redundancy replacement and others of a global data line, a write driver 42 for generating internal write data in accordance with external write data and transmitting the internal write data to a local data line pair (LIOP) through a global data bus, a read amplifier 43 for amplifying data read from a selected memory cell, and an output portion 44 for further amplifying the data amplified by read amplifier 43 to generate external output data.

These circuits 41 to 44 are supplied with the operating power supply voltage by a high-side local power supply line (hereinafter, simply referred to as the local power supply line) IVL1 and a low-side local power supply line (hereinafter, referred to as the local ground line) IGL1.

Local power supply line IVL1 receives external high-side power supply voltage VDD through a P-channel MOS transistor PT1. Local ground line IGL1 receives external low-side power supply voltage VSS (ground voltage GND) through an N-channel MOS transistor NT1. MOS transistors PT1 and NT1 are set to the OFF state while power down instruction signals PD and /PD are asserted, and maintain local power supply line IVL1 and local ground line IGL1 at a high impedance state (floating state), respectively.

Output portion 44 is constantly supplied with ground voltage VSS (GND) at its final output stage, and when power down instruction signal PD is asserted, the output node thereof is fixed to the ground voltage GND level. Thus, the output interconnection lines to the logic circuit or the like is prevented from entering an electrically floating state to be unstable.

In the power down mode, in these circuit blocks 41 to 44, a path through which a current flows from a high-side power supply node to the ground node is cut off and current consumption is reduced.

Figure 4:
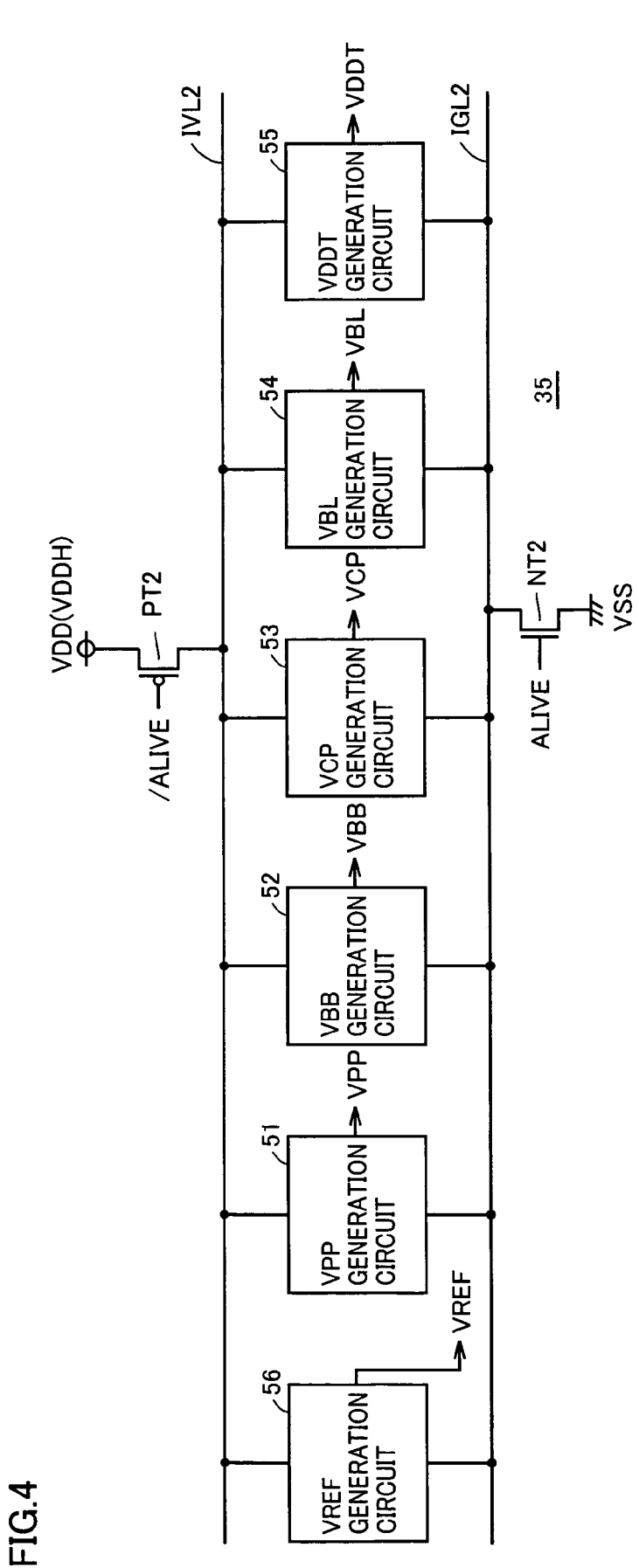
FIG. 4 schematically shows a configuration of an internal voltage generation portion included in a power supply control circuit shown in FIG. 2.

FIG. 4 schematically shows a configuration of a portion for generating internal voltages included in power supply control circuit 35 shown in FIG. 2. In FIG. 4, power supply control circuit 35 includes circuits 51 to 55 for generating internal voltages VPP, VBB, VCP, VBL, and VDDT, respectively. A VPP generation circuit 51 and a VBB generation circuit 52 are each configured, for example, by means of a charger pump circuit, and generate a boost voltage (high voltage) VPP and negative voltage VBB at a predetermined voltage level through charger pumping operation of a capacitor.

VCP generation circuit 53 and VBL generation circuit 54 generate an optimal voltage determined depending on a memory cell structure and an intermediate voltage which is ½ of a memory array power supply voltage VDDT, as a cell plate voltage VCP and a bit line precharge voltage VBL, respectively.

VDDT generation circuit 55 is configured, for example, by a voltage down converter (VDC) and sets a voltage level of memory array power supply voltage VDDT to a voltage level defined by a reference voltage. The internal voltage generation circuit further includes a reference voltage (VREF) generation circuit 56. In accordance with reference voltage VREF from reference voltage generation circuit 56, the voltage level of the voltage generated by each of the circuits 51 to 55 is set. FIG. 4 shows that reference voltage generation circuit 56 generates a single reference voltage VREF. Each circuit, however, is provided with a reference voltage at different voltage level, in accordance with the level of each generating voltage.

These generation circuits 51 to 56 receive the voltages on a local high-side power supply line (hereinafter referred to as the local power supply line) IVL2 and a local low-side power supply line (hereinafter referred to as the local ground line) IGL2 as the operating power supply voltages. Local high-side power supply line IVL2 is coupled to the external high-side power supply node through a P-channel MOS transistor PT2. The external high-side power supply node is supplied with external power supply voltage VDD or VDDH. Local ground line IGL2 is coupled to the low-side power supply node (ground node) through an N-channel MOS transistor NT2.

These MOS transistors PT2 and NT2 are rendered conductive while wake-up signal ALIVE is asserted, and transmit high-side power supply voltage VDD and low-side power supply voltage VSS (ground voltage GND) to local power supply line IVL2 and local ground line IGL2, respectively. While wake-up signal ALIVE is negated, MOS transistors PT2 and NT2 are set to the OFF state, and local power supply line IVL2 and local ground line IGL2 are isolated from the external high-side power supply node and the external low-side power supply (ground) node respectively. Therefore, when wake-up signal ALIVE is negated in the power down mode, a path through which the current flows from the high-side power supply node to the low-side power supply (ground) node in the internal voltage generation circuit is cut off.

Whether the power supply voltage generated by each internal power supply voltage generation circuit has attained to a predetermined voltage level is detected by level detection circuit 13 shown in FIG. 2, and when power supply ready signal PWR_RDY shown in FIG. 2 is asserted, the refresh operation or external access to the memory circuit is permitted.

Figure 5:
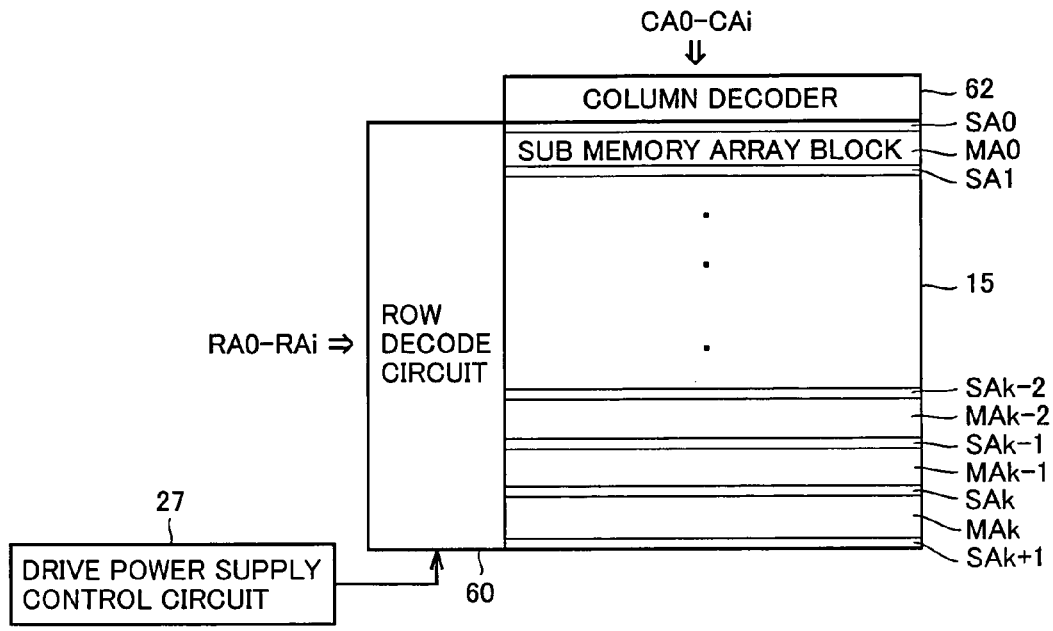
FIG. 5 schematically shows a configuration of a memory array shown in FIG. 2.

FIG. 5 schematically shows an exemplary configuration of memory array 15 shown in FIG. 2. In FIG. 5, memory array 15 is divided into a plurality of sub memory array blocks MA0 to MAk. In each of these sub memory array blocks MA0 to MAk, the memory cells are arranged in rows and columns.

Sense amplifier bands SA0 to SAk+1 are provided corresponding to sub memory array blocks MA0 to MAk. These sense amplifier bands SA1 to SAk are shared by adjacent sub memory array blocks. Sense amplifier bands SA0 and SAk+1 are provided for sub memory array blocks MA0 and MAk respectively. The sense amplifier bands arranged on opposite sides of a single sub memory array block MAi (i=0–k) sense and amplify data of the memory cells in sub memory array block MAi.

Array drive control portion 25 shown in FIG. 2 includes a row decode circuit 60 and a column decode circuit 62 provided for memory array 15. Row decode circuit 60 performs a row selection operation in sub memory array blocks MA0 to MAk, in accordance with row address bits RA0 to RAi included in an address signal ADD. Row decode circuit 60 allows selection of one sub memory array block or a plurality of sub memory array blocks in parallel, and in the selected sub memory array block, selection of a memory cell row and sensing and amplification of memory cell data are performed.

Column decode circuit 62 generates a column selection signal in common to sub memory array blocks MA0 to MAk, in accordance with column address bits CA0 to CAi included in address signal ADD.

Figure 6:
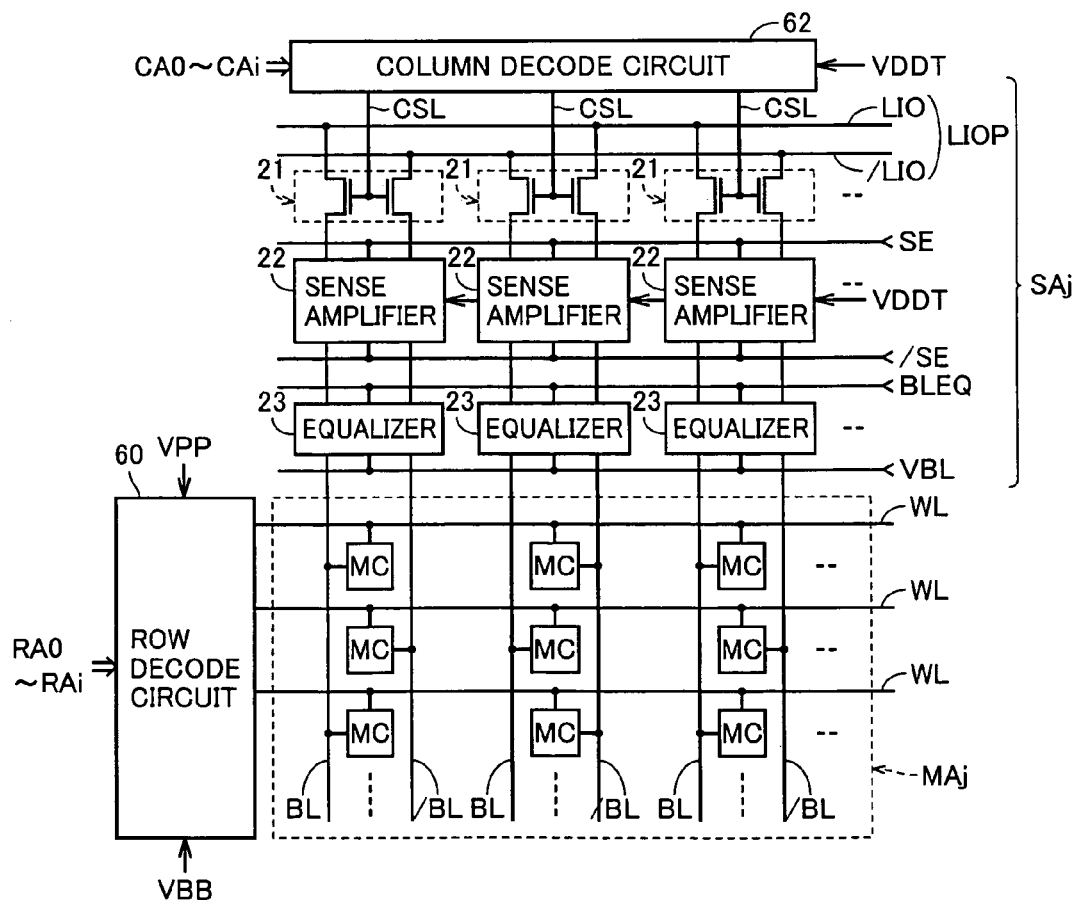
FIG. 6 schematically shows a configuration of a sub array block and a sense amplifier band shown in FIG. 5.

FIG. 6 schematically shows a configuration of sub memory array block MAj and sense amplifier band SAj shown in FIG. 5. In FIG. 6, memory cells MC are arranged in rows and columns in sub memory array block MAj. A word line WL is arranged corresponding to each row of memory cells MC, and a bit line pair BL, /BL is arranged corresponding to each column of the memory cells.

In sense amplifier band SAj, a column selection gate 21, a sense amplifier 22 and an equalizer 23 are provided for each bit line pair BL, /BL. Column selection gate 21 is rendered conductive in accordance with the column selection signal transmitted from column decode circuit 62 onto a column selection line CSL, to electrically connect corresponding bit lines BL and /BL to local data lines LIO and /LIO. Local data lines LIO and /LIO constitute a local data line pair LIOP and transfer 1-bit data. Local data line pair LIOP is coupled to a global data bus provided in common to sub memory array blocks MA0 to MAk (this coupling part not shown).

Sense amplifier 22 includes a pair of cross-coupled inverters, and is activated in accordance with sense amplifier activation signals SE and /SE, to sense, amplify and latch a voltage difference between corresponding bit lines BL and /BL. Equalizer 23 supplies an intermediate voltage VBL to corresponding bit lines BL and /BL in accordance with a bit line equalization instruction signal BLEQ, to equalize the bit lines to the intermediate voltage level.

Power supply voltage VDDT is supplied to column decode circuit 62 and sense amplifier 22 as the high-side power supply voltage. High voltage VPP and negative voltage VBB are supplied to row decode circuit 60 as the high-side and low-side power supply voltages.

Figure 7:
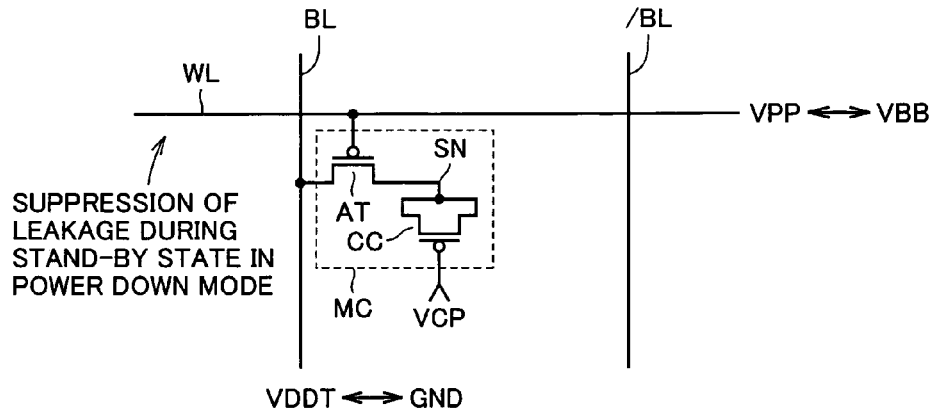
FIG. 7 schematically shows a configuration of a memory cell shown in FIG. 6.

FIG. 7 shows an exemplary configuration of memory cell MC shown in FIG. 6. In FIG. 7, memory cell MC includes a capacitor CC and an access transistor AT. Capacitor CC is configured with a P-channel MOS transistor, which receives cell plate voltage VCP at its gate, and has impurity regions commonly connected to a storage node SN. Similarly, access transistor AT is also configured with a P-channel MOS transistor, and is selectively rendered conductive in accordance with a signal voltage on word line WL, to electrically connect storage node SN the to corresponding bit line BL.

In the memory array, memory cell MC is connected between word line WL and one of bit lines BL and /BL. Bit lines BL and /BL have a so-called folded bit line arrangement. This memory cell MC stores 1-bit data. However, a configuration for storing 1-bit data using two memory cells connected to bit lines BL and /BL respectively may be employed, as in 2-cell/bit-DRAM (twin cell RAM) or the like.

In a general-purpose DRAM, in order to reduce an area occupied by memory cell capacitor CC, the memory cell capacitor is formed into a three-dimensional structure and therefore, manufacturing process steps are complicated. On the other hand, the embedded DRAM is formed on the common semiconductor chip together with the logic circuit based on a CMOS process. Therefore, it is required that the logic circuit and the embedded DRAM are formed through the same manufacturing process. In addition, it is also required that a height difference between the logic circuit portion and the memory cell array portion of the DRAM core is made as small as possible. Thus, a PMOS transistor is used as the memory cell capacitor and a so-called planar type capacitor is employed. Access transistor AT is configured with a P-channel MOS transistor.

Access transistor AT is a logic transistor (transistor having the same structure as the transistor in the logic circuit) fabricated on the manufacturing process the same as the process for the logic circuit. As the feature size in the embedded DRAM is made smaller with miniaturization of the process, the size of access transistor AT is also made smaller, and accordingly an absolute value of a threshold voltage is lowered and the off-leakage current becomes not negligible. Therefore, word line WL is set to the high voltage VPP level in the non-selected state and set to the negative voltage VBB level in the selected state. Assuming that the absolute value of the threshold voltage of access transistor AT is set to Vthp, this voltage VBB is set to the following level.

$$V_{BB} = GND - V_{thp}$$

Normally, absolute value Vthp of the threshold voltage is in a range from 0.2 to 0.5V. A voltage amplitude of bit line BL (and /BL) is between high-side power supply voltage (hereinafter referred to as the power supply voltage) VDDT and low-side power supply voltage (hereinafter referred to as the ground voltage) GND. Therefore, by setting word line WL to the negative voltage VBB level in the selected state, the voltage at the ground voltage GND level on bit line BL can be transmitted to storage node SN. On the other hand, while word line WL is in the non-selected state, the voltage level thereof is set to voltage VPP appropriately higher than memory array power supply voltage VDDT. Thus, even when the voltage level of storage node SN and bit line BL is set to memory array power supply voltage VDDT, a reverse-biased state is established between the gate and the source of access transistor AT and the off-leakage current is suppressed.

Storage node SN accumulates electric charges in accordance with storage data. Where an MOS capacitor is employed as memory cell capacitor CC, storage node SN has an inversion layer formed in a channel region (when H data is stored). When L data is stored, a capacitance value of memory cell capacitor CC is lower. Therefore, in order to hold the electric charges held in memory cell capacitor CC, the off-leakage current of access transistor AT should sufficiently be suppressed. As the electric charges held in memory cell capacitor CC flow out due to the leakage current, the refresh operation is performed at predetermined intervals and the storage data is written again.

In this refresh operation, the following operation is performed. Refresh address counter 11 included in control portion 30 shown in FIG. 2 performs a count-up operation in synchronization with refresh clock PHY, to generate the refresh address. In accordance with the refresh address, word line WL or a set of word lines WL are successively selected in memory array 15, and memory cell capacitor CC in the selected row is electrically coupled to corresponding bit line BL or /BL. By the time of this internal data reading, precharge of bit lines BL and /BL to a precharge voltage VBL by equalizer 23 has been completed. Therefore, when the word line is selected, the voltage levels of bit lines BL and /BL change from precharge voltage VBL in accordance with the storage data in memory cells MC. Sense amplifier 22 is activated by sense amplifier activation signals SE and /SE, to sense and amplify a voltage difference between associated bit lines BL and /BL. The bit line on the higher potential is driven to the cell power supply voltage VDDT level, and the other bit line on the lower potential is driven to the ground voltage GND level. As a result of full swing of the voltages of bit lines BL and /BL implemented by sense amplifier 22, memory power supply voltage VDDT or ground voltage GND is transmitted again to storage node SN through access transistor AT. Thus, the storage data in memory cell MC can be refreshed.

Figure 8:
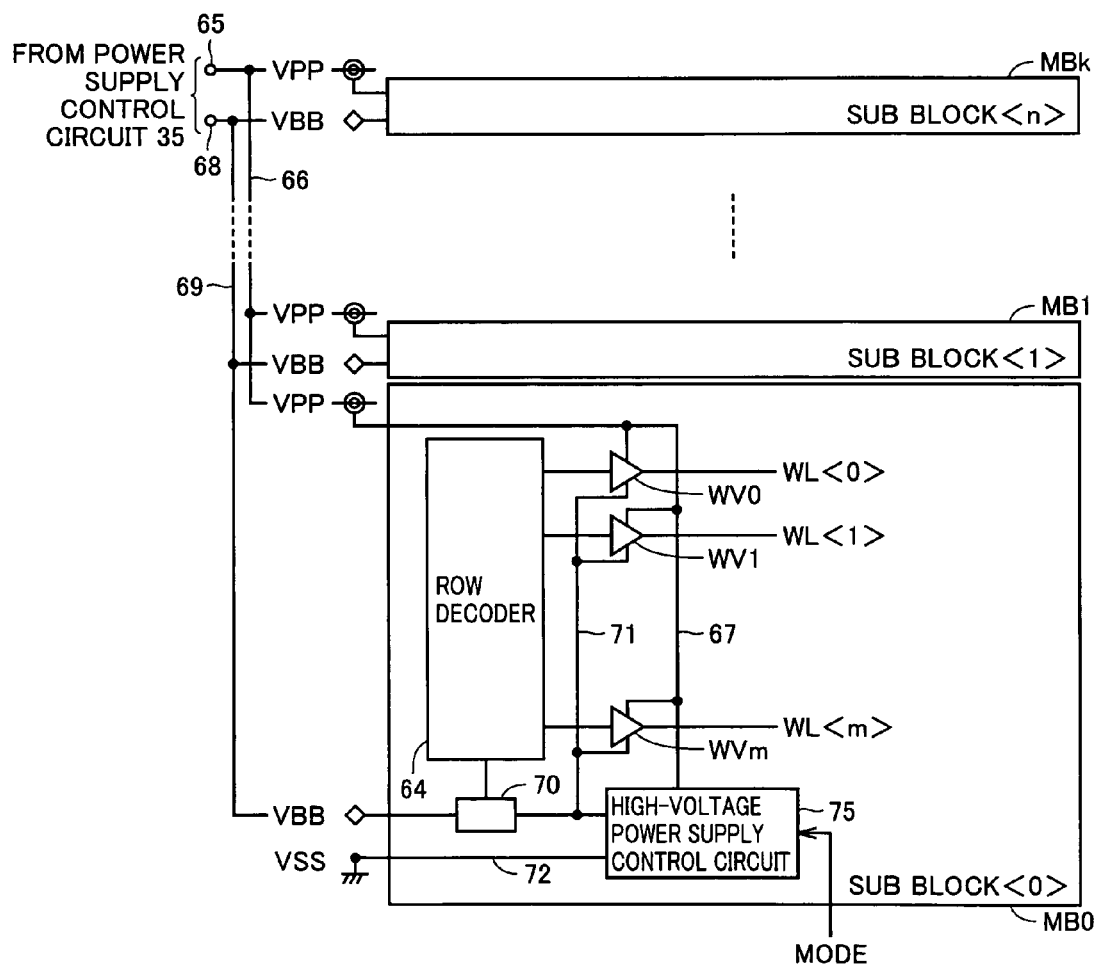
FIG. 8 schematically shows a configuration of a main portion of a semiconductor memory device according to a first embodiment of the present invention.

FIG. 8 schematically shows a configuration of the row decode circuit shown in FIGS. 5 and 6. In FIG. 8, the memory array is divided into a plurality of sub blocks MB0 to MBk. As sub blocks MB0 to MBk are identical in internal configuration, FIG. 8 representatively shows a configuration of a portion related to row selection in sub block MB0.

In sub block MB0, word lines WL<0> to WL<m> are provided. The row decode circuit includes a row decoder 64 and word line drivers WV0 to WVm provided corresponding to word lines WL<0> to WL<m>, respectively. In the selected sub block, one word line is driven to a selected state. Here, the voltage level of the selected word line is set to the negative voltage VBB level.

High voltage VPP from power supply control circuit 35 is supplied through a global high voltage line (first global voltage line) 66, in common to sub blocks MB0 to MBk through a node 65. In each of sub blocks MB0 to MBk, high voltage VPP is applied from high voltage node 65 through global high voltage line 66 and transmitted onto an internal local high voltage line (first local voltage line) 67.

Negative voltage VBB from power supply control circuit 35 is supplied from a node 68 through a global negative voltage line (second global voltage line) 69 to each of sub blocks MB0 to MBk. In each of sub blocks MB0 to MBk, negative voltage VBB is transmitted to a local negative voltage line 71 and row decoder 64 through a negative voltage setting circuit 70. In addition, low-side power supply voltage VSS (ground voltage GND) is supplied to negative voltage setting circuit 70 through a global ground line (global reference voltage line) 72.

When a corresponding sub block is selected, negative voltage setting circuit 70 supplies negative voltage VBB from global negative voltage line 69 to local negative voltage line (second local voltage line) 71 within the sub block. When the corresponding sub block is not selected, negative voltage setting circuit 70 clamps the upper limit voltage level of corresponding local negative voltage line 71 to the low-side power supply voltage level (VSS+Vthn; Vthn representing the threshold voltage of the N-channel MOS transistor) or lower.

By supplying negative voltage VBB only to the selected sub block for transmitting negative voltage VBB onto the word line corresponding to an addressed row, current consumption related to negative voltage VBB is reduced.

Local negative voltage line 71 and local high voltage line 67 are coupled to word line drivers WV0 to WVm, and supply the low-side and high-side operating power supply voltages, respectively.

Each of sub blocks MB0 to MBk is further provided with a high-voltage power supply control circuit 75 included in drive power supply control circuit 27 shown in FIG. 2. When a mode instruction signal MODE instructs the stand-by cycle in the power down mode, high-voltage power supply control circuit 75 adjusts the power supply connection configuration so as to suppress voltage lowering on local high voltage line 67. High-voltage power supply control circuit 75 suppresses leakage and lowering of high voltage VPP on word lines WL<0> to WL<m> through word line drivers WV0 to WVm, of which detailed configuration will be described later.

Figure 9:
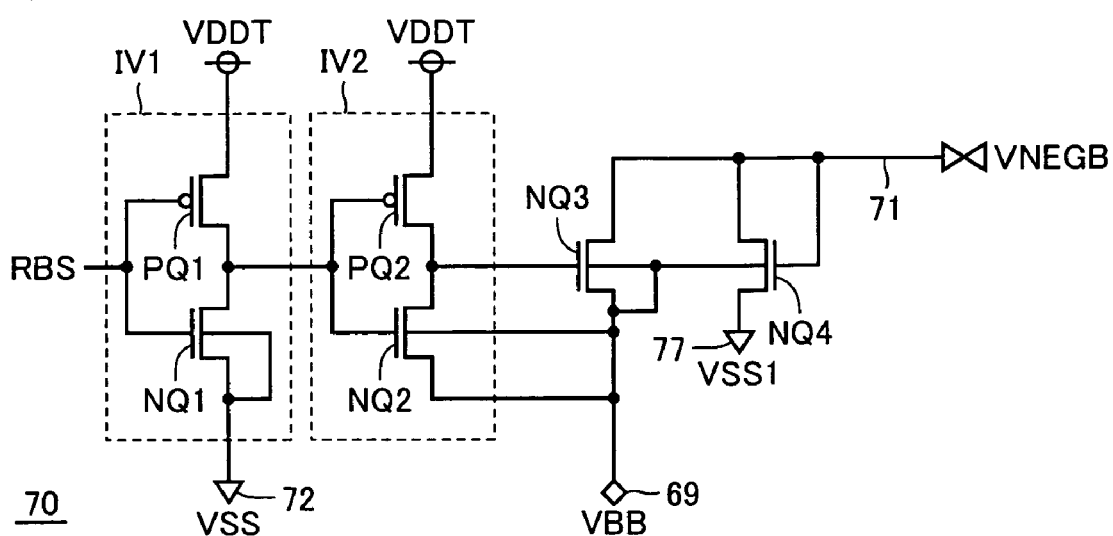
FIG. 9 shows an exemplary configuration of a negative voltage setting circuit shown in FIG. 8.

FIG. 9 shows an exemplary configuration of negative voltage setting circuit 70 shown in FIG. 8. In FIG. 9, negative voltage setting circuit 70 includes an inverter IV1 receiving a sub block selection signal RBS, an inverter IV2 receiving an output signal from inverter IV1, an N-channel MOS transistor NQ3 coupling global negative voltage line 69 to local negative voltage line 71 in accordance with an output signal from inverter IV2, and an N-channel MOS transistor NQ4 clamping a voltage VNEGB of local negative voltage line 71.

Inverter IV1 receives memory cell power supply voltage VDDT and low-side power supply voltage (hereinafter referred to as the ground voltage) VSS on global ground line 72 as the operating power supply voltages. Inverter IV1 includes a P-channel MOS transistor PQ1 and an N-channel MOS transistor NQ1. MOS transistor NQ1 has the backgate coupled to global ground line 72.

Inverter IV2 includes a P-channel MOS transistor PQ2 and an N-channel MOS transistor NQ2, and receives memory cell power supply voltage VDDT and negative voltage VBB on global negative voltage line 69 as the operating power supply voltages. MOS transistor NQ2 also has the backgate coupled to global negative voltage line 69.

N-channel MOS transistor NQ3 has the backgate connected to global negative voltage line 69, and is rendered conductive when the output signal from inverter IV2 is set to H level, to transmit negative voltage VBB onto local negative voltage line 71 as low-side power supply voltage VNEGB of the word line driver.

N-channel MOS transistor NQ4 has the gate and the drain connected to local negative voltage line 71 and receives ground voltage VSS1 on a local ground line 77 at the source. Connection of local ground line 77 with global ground line 72 is switched by high-voltage power supply control circuit 75 shown in FIG. 8 and the voltage level thereof is accordingly adjusted (the configuration will be described later). Therefore, MOS transistor NQ4 sets the upper limit voltage of voltage VNEGB of local negative voltage line 71 to voltage VSS1+Vthn, with Vthn being the threshold voltage. The clamping operation by MOS transistor NQ4 prevents voltage VNEGB on local negative voltage line 71 from increasing due to the leakage current during the stand-by cycle and prevents malfunction in the word line drivers.

When the corresponding sub block is in the non-selected state (stand-by state), block selection signal RBS is at L level. In this state, in inverter IV1, MOS transistor PQ1 is in the ON state and MOS transistor NQ1 is in the OFF state. Therefore, the output signal from inverter IV1 is set to H level, that is, the memory cell power supply voltage VDDT level. Accordingly, in inverter IV2, MOS transistor PQ2 is in the OFF state, MOS transistor NQ2 is in the ON state, and the signal at the negative voltage VBB level is output from inverter IV2. In this state, MOS transistor NQ3 has the gate and the source set to the same voltage level and it is set to the OFF state, and local negative voltage line 71 and global negative voltage line 69 are isolated from each other. In this state, as described previously, the upper limit value of the voltage VNEGB on local negative voltage line 71 is clamped to VSS1+Vthn.

When block selection signal RBS is set to H level and the memory selection operation is performed in the corresponding sub block, the output signal from inverter IV1 is set to L level, that is, the ground voltage VSS level. The threshold voltage of MOS transistor NQ2 is |VSS−VBB| or higher, and MOS transistor NQ2 is set to the OFF state in this state. The output signal from inverter IV2 is set to the memory cell power supply voltage VDDT level, and MOS transistor NQ3 is set to the ON state. In response, local negative voltage line 71 and global negative voltage line 69 are electrically coupled to each other, and the voltage (hereinafter referred to as the local negative voltage) VNEGB on local negative voltage line 71 is set to the negative voltage VBB level. MOS transistor NQ4 maintains the OFF state, because the reverse biased state is established between the gate and the source thereof.

Figure 10:
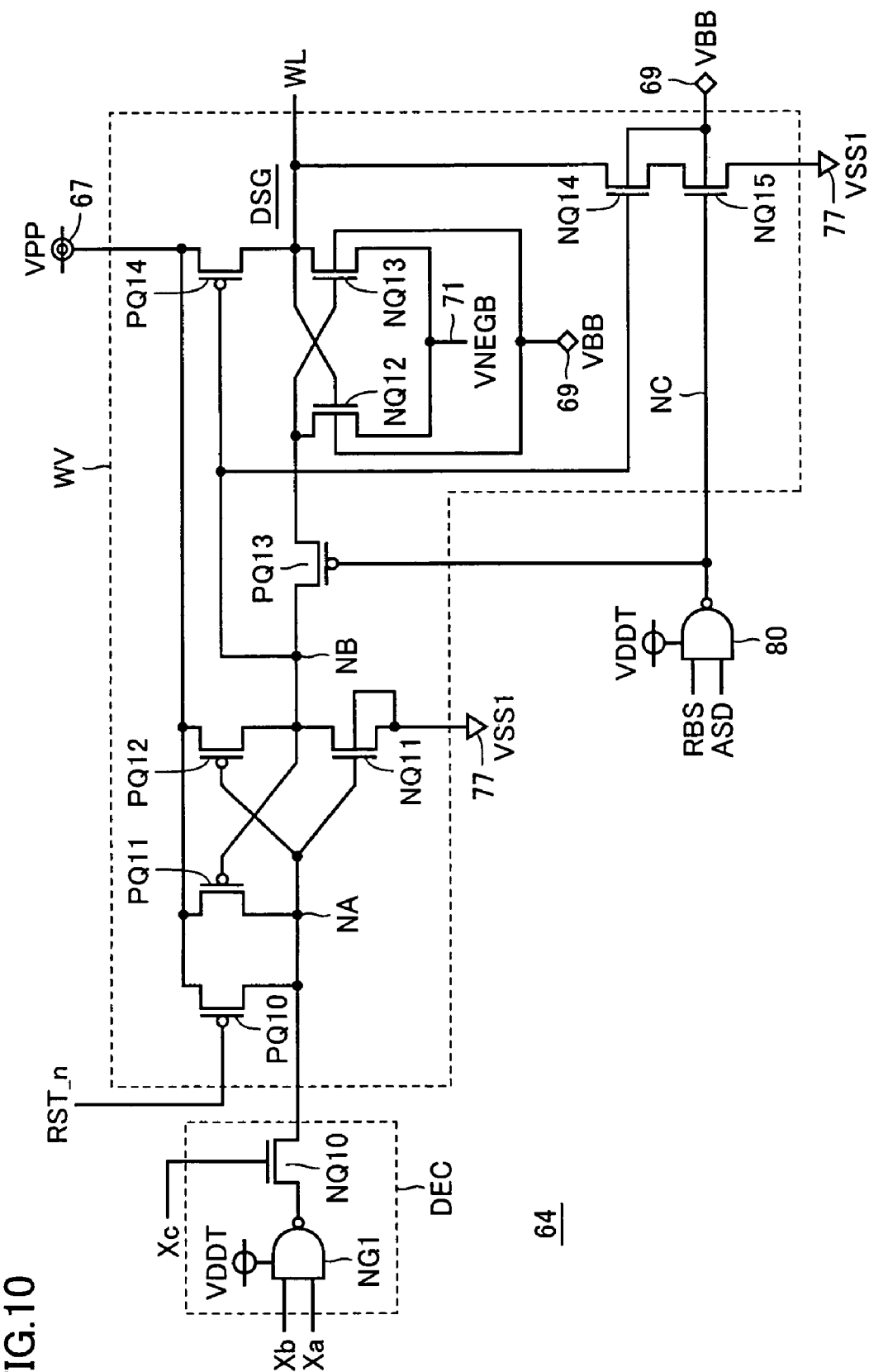
FIG. 10 shows an exemplary configuration of a word line driver shown in FIG. 8.

FIG. 10 shows an exemplary configuration of row decoder 60 and word line drivers WV0 to WVm shown in FIG. 8. FIG. 10 representatively shows the configuration provided corresponding to a single word line WL.

Row decoder 64 includes a unit decoder DEC provided corresponding to each word line WL. Unit decoder DEC includes a two-input NAND gate NG1 receiving row predecode signals Xa and Xb and an N-channel MOS transistor NQ10 transmitting an output signal received from NAND gate NG1 to a node NA in accordance with a predecode signal Xc.

Predecode signals Xa to Xc are generated by predecoding address signal ADD in a not-shown predecode circuit (for example, included in control portion 30 shown in FIG. 2). Predecode signals Xa to Xc are each changed between memory cell power supply voltage VDDT and ground voltage VSS. NAND gate NG1 is supplied with memory cell power supply voltage VDDT as the high-side power supply voltage.

Word line driver WV includes a P-channel MOS transistor PQ10 for precharging node NA to the high voltage VPP level in accordance with a reset signal RST_n and cross-coupled P-channel MOS transistors PQ11 and PQ12 for latching a potential of a node at a higher potential out of nodes NA and NB. High voltage VPP is supplied through local high voltage line 67 arranged corresponding to each sub block. Reset signal RST_n is set to L level in the stand-by state.

MOS transistor PQ11 is connected between local high voltage line 67 and node NA and has a gate connected to node NB. MOS transistor PQ12 is connected between local high voltage line 67 and node NB and has a gate connected to node NA.

Word line driver WV further includes an N-channel MOS transistor NQ11 for electrically coupling node NB and local ground line 77 to each other in accordance with the potential of node NA, a P-channel MOS transistor PQ13 for transmitting the voltage of node NB in accordance with an output signal from a block selection circuit 80, and a drive stage DSG for driving word line WL in accordance with a signal transmitted through MOS transistor PQ13.

Block selection circuit 80 outputs a signal at L level when both of block selection signal RBS and a word line drive timing signal ASD are asserted. The block selection signal is generated, for example, by decoding an address signal by a block decoder included in control portion 30 shown in FIG. 2.

Word line drive stage DSG includes a P-channel MOS transistor PQ14 for electrically coupling word line WL to local high voltage line 67 in accordance with the voltage of node NB, cross-coupled N-channel MOS transistors NQ12 and NQ13, and N-channel MOS transistors NQ14 and NQ15 connected in series between word line WL and local ground line (local reference voltage line) 77.

MOS transistor NQ12 is connected between local negative voltage line 71 and MOS transistor PQ13 and has a gate connected to word line WL. MOS transistor NQ13 is connected between word line WL and local negative voltage line 71 and has a gate coupled to MOS transistor PQ13. MOS transistors NQ12 and NQ13 have the backgates (substrate region) supplied with negative voltage VBB from global negative voltage line 69.

MOS transistor NQ14 is also rendered conductive in accordance with the voltage level of node NB, and MOS transistor NQ15 is selectively rendered conductive in accordance with the output signal of block selection circuit 80. These MOS transistors NQ14 and NQ15 have also the backgates supplied with negative voltage VBB from global negative voltage line 69.

Figure 11:
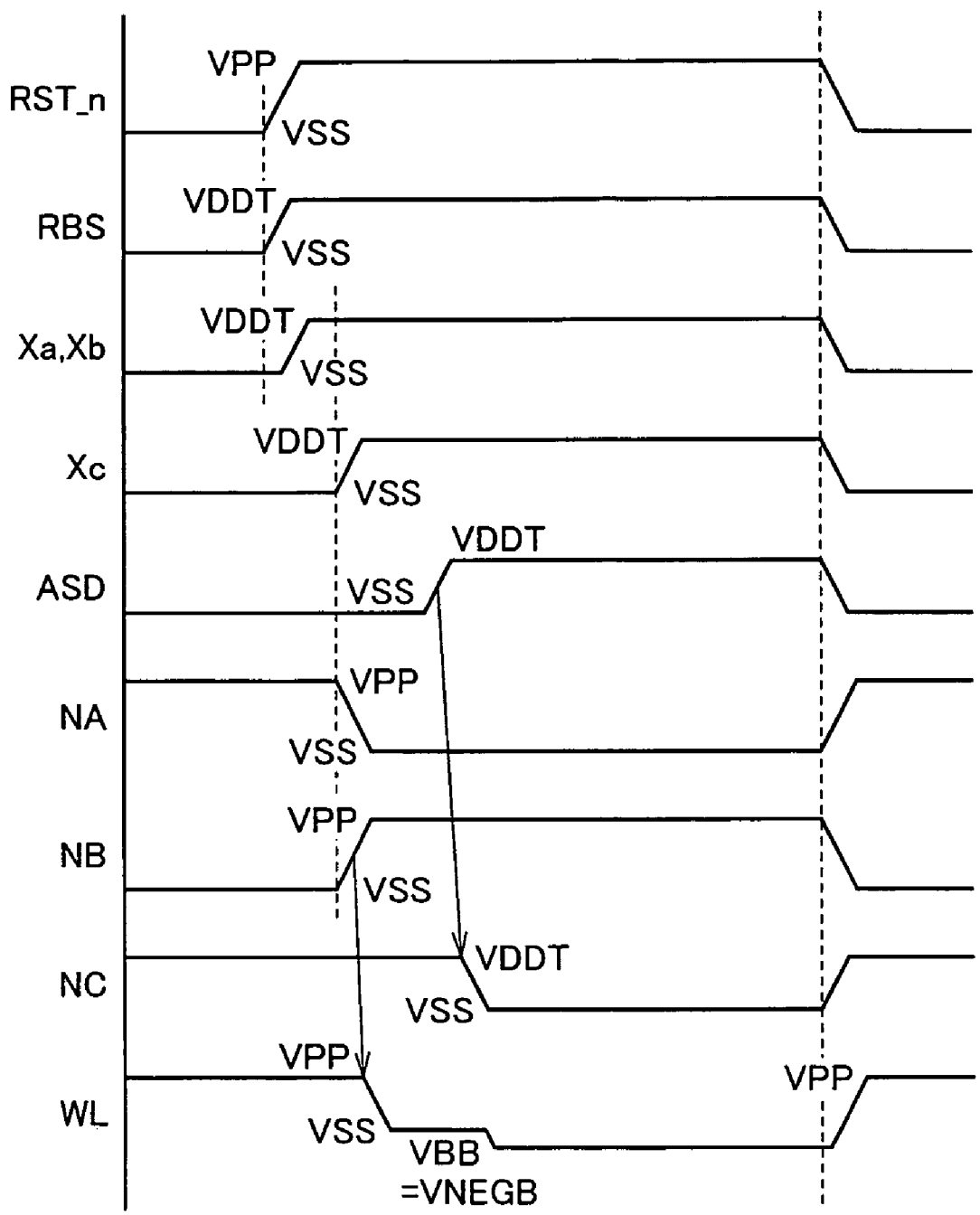
FIG. 11 is a signal waveform diagram representing an operation of the word line driver shown in FIG. 10.

FIG. 11 is a signal waveform diagram representing an operation of unit decoder DEC and word line driver WD shown in FIG. 10 when a word line is selected. An operation of a word line selection portion shown in FIG. 10 will be described with reference to FIG. 11.

In the stand-by state, reset signal RST_n is set to L level. In the description below, the stand-by state refers to both of the stand-by cycle in the normal operation mode and the stand-by cycle between the refresh time periods in the deep power down mode.

In the stand-by state, predecode signal Xc is also set to L level and MOS transistor NQ10 is in the OFF state in unit decoder DEC. Therefore, if high voltage VPP on local high voltage line 67 is not lower than an absolute value of the threshold voltage of MOS transistor PQ10, MOS transistor PQ10 is set to the ON state and node NA is precharged to the voltage VPP level on local high voltage line 67. In the description of the word line driver, for the sake of simplicity of description, an example where a voltage level of high voltage VPP is maintained at a voltage level higher than memory cell power supply voltage VDDT stably and a voltage level of negative voltages VBB and VNEGB is also maintained stably is considered.

As block selection signal RBS is at L level, the output signal from block selection circuit 80 is at H level. Therefore, MOS transistor PQ13 is in the OFF state. As node NA is at the high voltage VPP level, node NB is set to the voltage VSS1 (=VSS) level on local ground line 77 by MOS transistor NQ11. MOS transistor PQ14 is set to the ON state in accordance with the voltage at L level of node NB, word line WL is electrically coupled to local high voltage line 67, and the voltage level thereof is set to the high voltage VPP level. A node NC is set to H level (memory cell power supply voltage VDDT level) in accordance with the output signal from block selection circuit 80, and MOS transistor NQ15 is in the ON state. On the other hand, MOS transistor NQ14 is in the OFF state in accordance with the voltage on node NB, and word line WL is charged to the high voltage VPP level.

Here, MOS transistor NQ12 is set to the ON state and MOS transistor NQ13 is set to the OFF state. Therefore, a leakage current flowing path from word line WL through MOS transistor NQ13 to local negative voltage line 71 is cut off, and a leakage current flowing path from word line WL to local ground line 77 is also cut off. A drain node of MOS transistor NQ12 is maintained at the local negative voltage VNEGB level.

When a memory cell selection instruction is externally supplied, an active cycle starts. When the active cycle starts, reset signal RST_n is driven to the high voltage VPP level and MOS transistor PQ10 in word line driver WV is set to the OFF state. In addition, in accordance with a block address included in the supplied address signal, block selection signal RBS is asserted for a selected sub array block, and the voltage level thereof is raised to the memory cell power supply voltage VDDT level. At this time, however, word line drive timing signal ASD is still in the negated state and the output signal from block selection signal 80 is at H level.

Then, predecode signals Xa and Xb are set to a definite state and thereafter predecode signal Xc is set to the definite state. When these predecode signals Xa to Xc are all set to H level, the corresponding word line is designated. In this state, in unit decoder DEC, MOS transistor NQ10 is set to the ON state and node NA is driven to L level (ground voltage level) by NAND gate NG1. In response, MOS transistor PQ12 transitions to the ON state in word line driver WV, the voltage level of node NB is raised to the high voltage VPP level, and MOS transistor PQ14 in drive stage DSG is set to the OFF state. MOS transistor NQ14 is set to the ON state in accordance with the voltage at H level of node NB, word line WL is coupled to local negative voltage line 77, and the voltage level thereof is discharged to the ground voltage (VSS1=VSS).

In succession, word line drive timing signal ASD is asserted, the output signal from block selection circuit 80 is set to L level, and MOS transistor NQ15 is set to the OFF state. Node NB is at the high voltage VPP level, MOS transistor PQ13 is set to the ON state, and the gate voltage of MOS transistor NQ13 is set to H level, that is, the high voltage VPP level. Thus, word line WL is driven to the negative voltage VNEGB level on local negative voltage line 71.

When word line WL is driven to the negative voltage level, MOS transistor NQ15 is set to the OFF state in accordance with the output signal from block selection circuit 80. Therefore, word line WL and local ground line 77 are isolated from each other and transmission of negative voltage VBB to the ground line is prevented.

The absolute value of the voltage difference between negative voltage VBB and ground voltage VSS1 (=VSS) is not greater than the threshold voltage of MOS transistor NQ15. Accordingly, even if negative voltage VBB is transmitted from word line WL to MOS transistor NQ15, MOS transistor NQ15 maintains the OFF state.

In this state, the access transistor (P-channel MOS transistor) of the memory cell connected to word line WL is rendered conductive and reading or writing of memory cell data is performed.

When the active cycle completes, block selection signal RBS is negated, predecode signals Xa to Xc also fall to L level, and word line drive timing signal ASD is also negated. Thus, in unit decoder DEC, MOS transistor NQ11 is set to the OFF state and node NA is charged to the high voltage VPP level by MOS transistor PQ10. In response, MOS transistor NQ11 is set to the ON state and MOS transistor PQ12 is set to the OFF state, and node NB is discharged to the voltage (VSS1=VSS) on local ground line 77. MOS transistor PQ14 in drive stage DSG is set to the ON state and word line WL is again driven to the high voltage VPP level. The output signal from block selection circuit 80 is at H level (memory cell power supply voltage level) and MOS transistor PQ13 maintains the OFF state.

MOS transistor NQ12 is set to the ON state in accordance with the potential of word line WL, MOS transistor NQ13 receives negative voltage VNEGB at the gate, and set to the OFF state. Thus, word line WL is maintained at the high voltage VPP level.

MOS transistor NQ15 receives negative voltage VBB at the backgate. Therefore, in order to prevent forward biasing of a PN junction between the backgate and the source of MOS transistor NQ15, the voltage level of negative voltage VBB and ground voltage VSS1 is set to a voltage level not higher than a built-in voltage of the PN junction (for example, in a range from 0.2 to 0.6V).

In addition, during the active cycle, when predecode signal Xc is at H level and at least one of predecode signals Xa and Xb is at L level, the output signal from NAND gate NG1 is at H level, that is, the memory power supply voltage VDDT level. In this state, MOS transistor NQ11 is set to the ON state in accordance with the voltage at H level of node NA, node NB is maintained at the ground voltage level, and in response MOS transistor PQ11 is set to the ON state. Therefore, node NA is maintained at the high voltage VPP level. In unit decoder DEC, the gate of MOS transistor NQ11 is set to the memory cell power supply voltage VDDT level. Therefore, even when node NA is driven to the high voltage VPP level, MOS transistor NQ10 operates as a decoupling transistor, and transmission of high voltage VPP from node NA to the output portion of NAND gate NG1 of unit decoder DEC is prevented.

In the configuration of word line driver WV shown in FIG. 10, in transition of word line WL to the selected state, two-stage driving, that is, to the ground voltage level and then to the negative voltage level, is performed. Thus, it is prevented that electric charges charged by high voltage VPP on word line WL flow into local negative voltage line 71, and noise is generated on negative voltage VNEGB. In addition, it is prevented that current consumption in the negative voltage generation circuit increases for absorbing a discharging current upon selection of a word line.

[Modification of Word Line Drive Portion]

Figure 12:
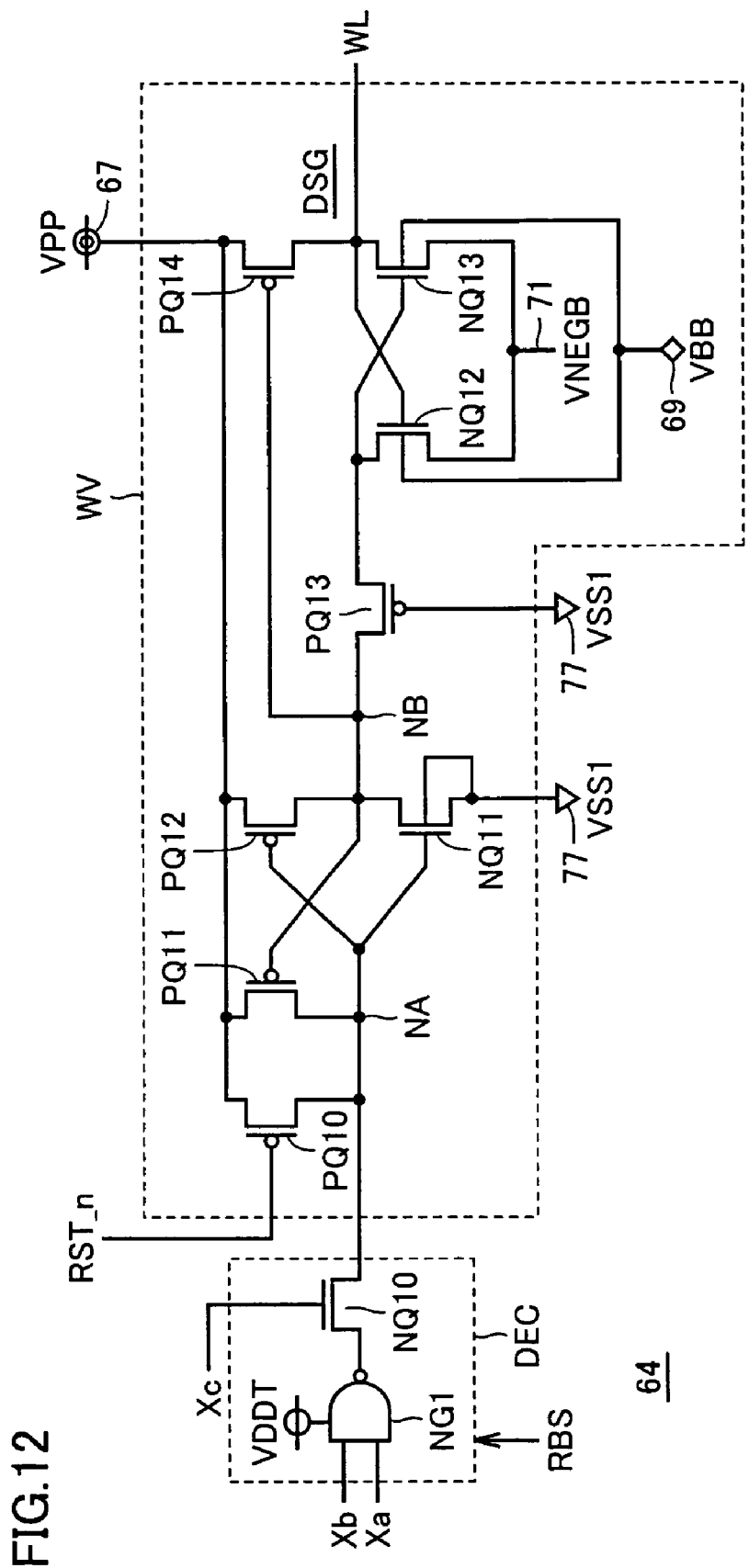
FIG. 12 shows a modification of the word line driver shown in FIG. 8.

FIG. 12 shows a configuration of a modification of row decoder 64 and word line drivers WV0 to WVm shown in FIG. 8. In row decoder 64 shown in FIG. 12, block selection signal RBS is supplied to unit decoder DEC. In the sub array block for which block selection signal RBS is asserted, unit decoder DEC is enabled and a predecode signal is decoded.

In word line driver WV, the gate of P-channel MOS transistor PQ13 in the stage preceding drive stage DSG is coupled to local ground line 77. In addition, for word line WL, N-channel MOS transistors NQ14 and NQ15 for discharging to the ground voltage are not provided. Word line WL changes in voltage between high voltage VPP and negative voltage VNEGB.

The configuration of word line driver WV shown in FIG. 12 is otherwise the same as that of word line driver WV shown in FIG. 10. Therefore, the corresponding components have the same reference characters allotted and detailed description thereof is not provided.

Figure 13:
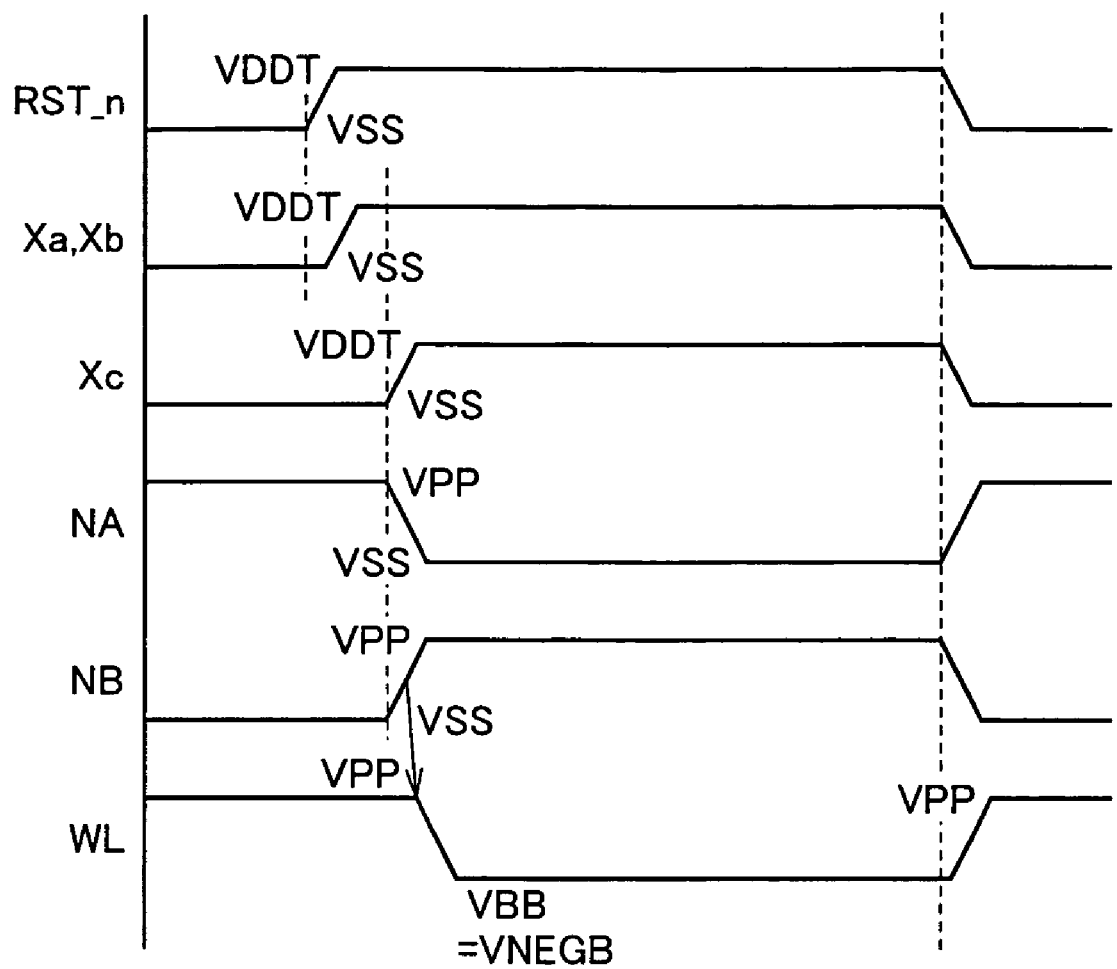
FIG. 13 is a signal waveform diagram representing an operation of the word line driver shown in FIG. 12.

FIG. 13 is a timing chart representing an operation of unit decoder DEC and word line driver WV shown in FIG. 12. The operation of unit decoder DEC and word line driver WV shown in FIG. 12 will briefly be described below with reference to FIG. 13.

In the stand-by state, in word line driver WV, node NA is maintained at the high voltage VPP level by MOS transistor PQ10. Therefore, node NB is maintained at the voltage VSS1 (=VSS) level on local ground line 77 by MOS transistor NQ11. In response, MOS transistor PQ14 is set to the ON state, and word line WL is maintained at the voltage VPP level on local high voltage line 67. In this state, MOS transistor NQ12 is set to the ON state, and MOS transistor NQ13 is in the OFF state, receiving negative voltage VNEGB at the gate through MOS transistor NQ12. Even when node NB is at the ground voltage level and MOS transistor PQ13 receives the voltage VSS1 on local negative voltage line 77 at the gate, MOS transistor PQ13 has the source node set to the negative voltage VNEGB level and therefore, it maintains the OFF state. Thus, it is ensured that local negative voltage line 71 and local ground line 77 are isolated from each other.

When the active cycle is started, reset signal RST_n is set to H level and MOS transistor PQ10 is set to the OFF state. Here, node NA is still maintained at the high voltage VPP level by MOS transistor PQ11. When block selection signal RBS is asserted, predecode signals Xa to Xc are each set to the definite state in the selected sub block. When predecode signals Xa to Xc are all set to H level in this state, the output signal from unit decoder DEC is set to L level and node NA is discharged to the ground voltage level (through unit decoder DEC). In response, MOS transistor NQ11 is set to the OFF state, MOS transistor PQ12 is set to the ON state, and node NB is charged to the high voltage VPP level. In response, MOS transistors PQ11 and PQ14 are set to the OFF state.

Node NB is set to the high voltage VPP level and MOS transistor PQ13 transmits this high voltage VPP to the gate of MOS transistor NQ13. In response, MOS transistor NQ13 is set to the ON state and word line WL is driven to the negative voltage VNEGB level.

The operation during transition of word line WL from the selected state to the non-selected state is the same as the operation represented in the timing chart in previous FIG. 11. When the active cycle is completed, each signal and node make transition to the state the same as in the stand-by state (stand-by cycle).

In the use of unit decoder DEC and word line driver WV shown in FIG. 12 as well, when word line WL makes transition to the selected state, electric charges may move to global negative voltage line 69 through local negative voltage line 71 and negative voltage VNEGB (=VBB) may vary. The negative voltage line has the hierarchical structure of global negative voltage line 69 and local negative voltage line 71, a parasitic capacitance of local negative voltage line 71 is large, and fluctuation in the negative voltage in selecting a word line can satisfactorily be suppressed.

In any embodiment described below, any of unit decoders DEC and word line drivers WV shown in FIGS. 10 and 12 may be employed. A condition that the local ground line, the local high voltage line and the local negative voltage line are arranged for word line driver WV should only be satisfied.

Figure 14:
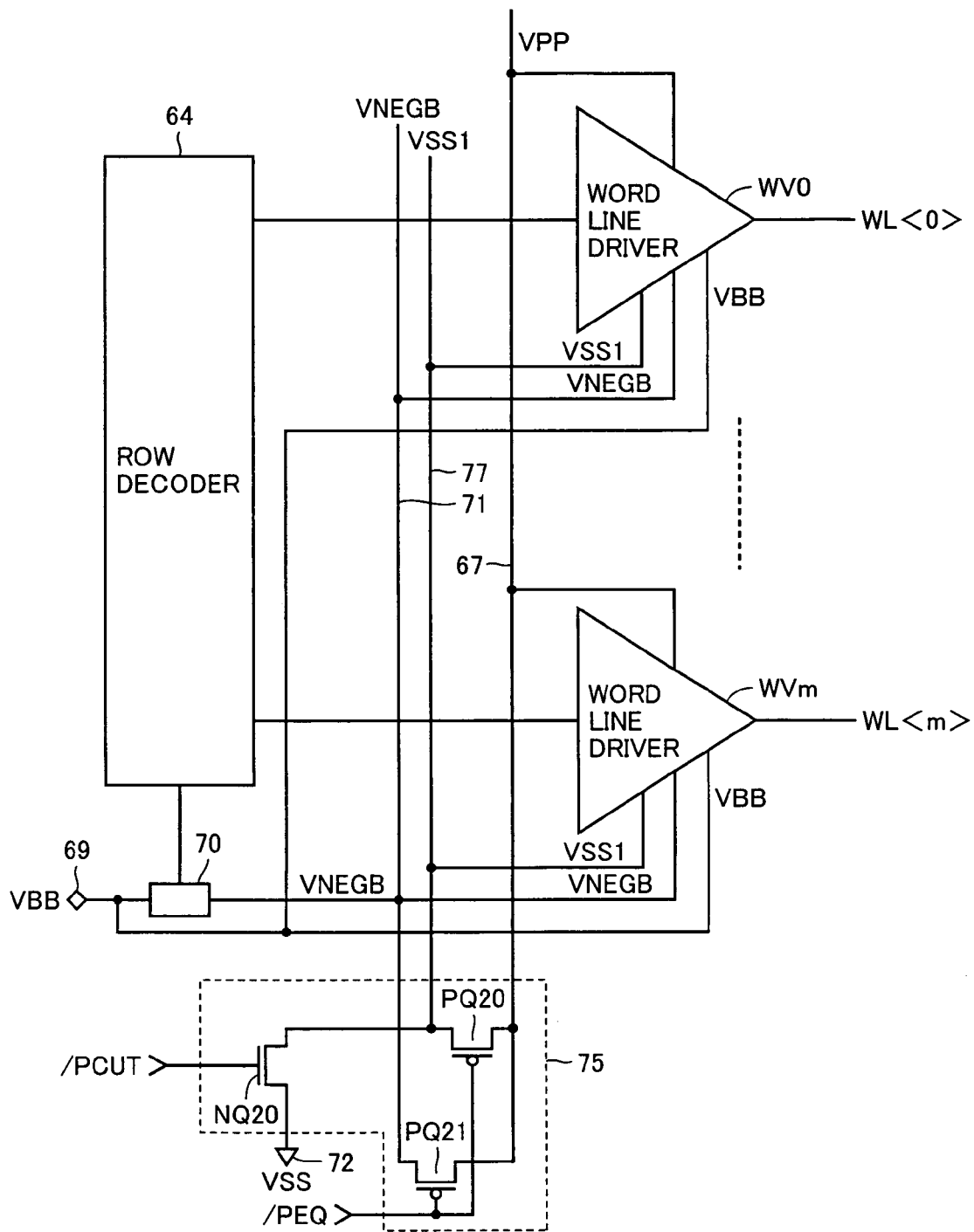
FIG. 14 shows a configuration of a high-voltage power supply control circuit according to the first embodiment of the present invention.

FIG. 14 shows a configuration of high-voltage power supply control circuit 75 included in the driver power supply control circuit according to the first embodiment of the present invention. High-voltage power supply control circuit 75 is provided for one sub block and high-voltage power supply control circuit 75 is provided in each sub block.

In FIG. 14, high-voltage power supply control circuit 75 includes P-channel MOS transistors PQ20 and PQ21 for equalizing the power supply and an N-channel MOS transistor NQ20 for cutting off the power supply. P-channel MOS transistor PQ20 electrically connects local high voltage line 67 with local ground line 77 in accordance with a power supply equalization instruction signal /PEQ. P-channel MOS transistor PQ21 electrically connects local high voltage line 67 with local negative voltage line 71 in accordance with power supply equalization instruction signal /PEQ. N-channel MOS transistor NQ20 electrically isolates local ground line 77 and global ground line 72 from each other in accordance with a power supply cut-off instruction signal /PCUT. A negative voltage is transmitted from negative voltage setting circuit 70 to local negative voltage line 71.

Word line drivers WV0 to WVm have any configuration of the word line drive circuits shown in previous FIGS. 10 and 12. Here, a state that local negative voltage VNEGB, high voltage VPP and ground voltage VSS1 are simply transmitted to word line drivers WV0 to WVm is shown, and power supply arrangement for word line drivers WV0 to WVm is representatively shown.

Figure 15:
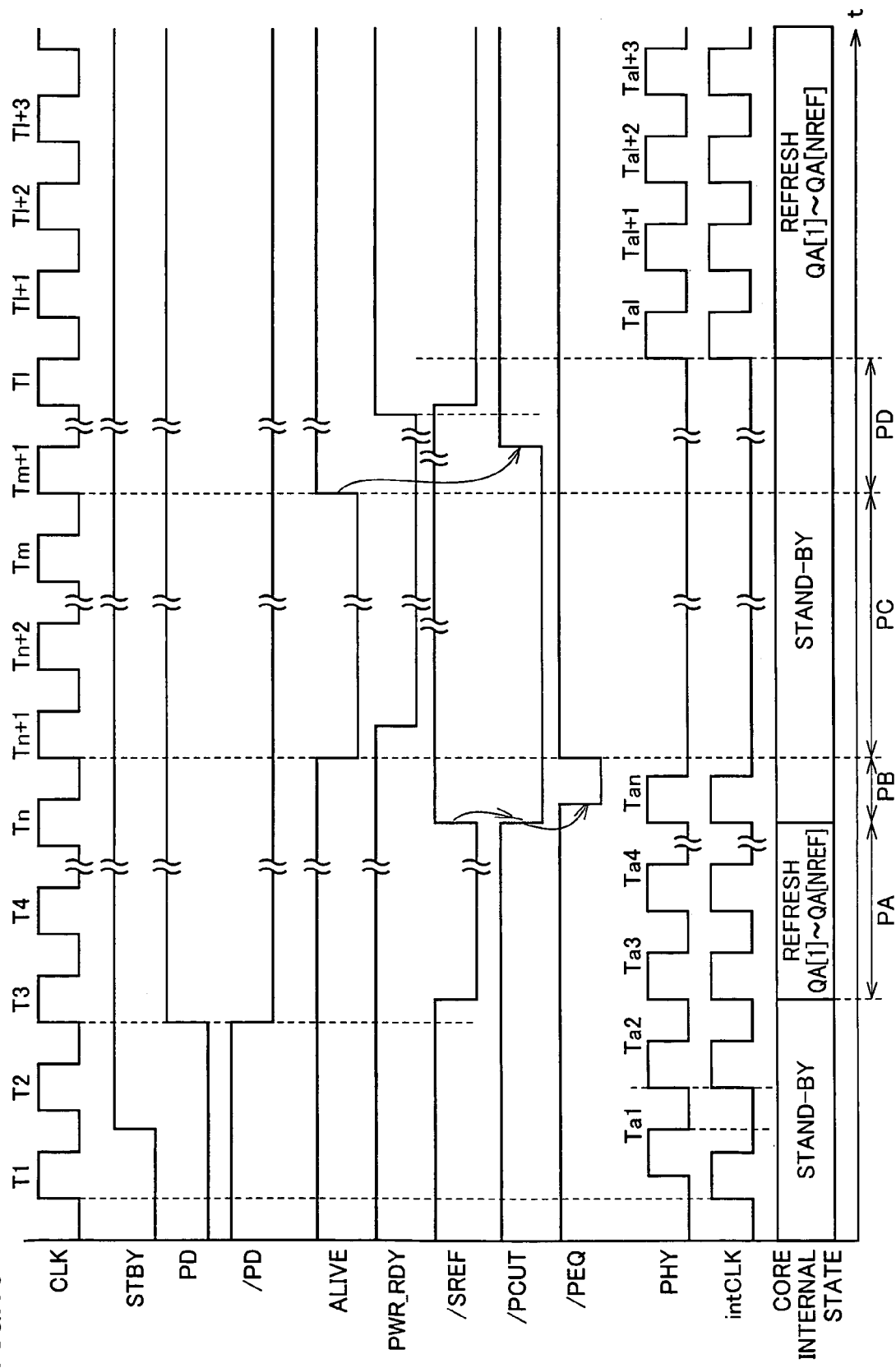
FIG. 15 is a timing chart representing an operation in a stand-by mode, of the semiconductor memory device according to the first embodiment of the present invention.

FIG. 15 is a timing chart representing an operation of high-voltage power supply control circuit 75 shown in FIG. 14. FIG. 15 also shows a control signal and a clock signal for the memory circuit shown in FIG. 2.

The operation of high-voltage control circuit 75 shown in FIG. 14 will be described hereinafter, with reference to the configuration of the memory circuit shown in FIG. 2 as appropriate.

In the normal operation mode in which external access is made, power management portion 40 shown in FIG. 2 generates internal clock signal intCLK in accordance with external clock signal CLK, and supplies the internal clock signal to control portion 30 in DRAM core (memory circuit) MEM1.

In this state, refresh clock PHY is issued from refresh clock generation circuit 12 included in power supply control circuit 35 shown in FIG. 2.

In a cycle T1 of external clock signal CLK, refresh clock PHY and internal clock signal intCLK are asynchronous with each other. When the DRAM core (memory circuit) is in the stand-by cycle, a low current consumption mode instruction signal (stand-by mode instruction signal) STBY from an external logic is asserted. When the low current consumption mode instruction signal (hereinafter referred to as the stand-by mode instruction signal) STBY is asserted, in power management portion 40 shown in FIG. 2, refresh clock PHY from refresh clock generation circuit 12 is selected instead of external clock signal CLK and transmitted to the DRAM core as internal clock signal intCLK. Therefore, from a cycle Ta2 of refresh clock PHY, refresh clock PHY and internal clock signal intCLK become synchronous with each other.

After one clock cycle elapses since assertion of stand-by mode instruction signal STBY, in a cycle T3 of external clock CLK, power down instruction signals PD and /PD are asserted. Accordingly, as shown in FIG. 3, power supply to each circuit is stopped in I/O portion 20 of the DRAM core. At this time, wake-up signal ALIVE is still in the asserted state, and power supply control circuit 35 shown in FIG. 2 generates various internal voltages in accordance with external power supply voltage VDD or VDDH.

When power down instruction signals PD and /PD are asserted, self-refresh instruction signal /SREF from power management portion 40 shown in FIG. 2 is asserted. In response to assertion of self-refresh instruction signal /SREF, the refresh operation is performed internally in synchronization with internal clock signal intCLK in control portion 30 of the DRAM core shown in FIG. 2. During the refresh operation, the refresh address from refresh counter 11 is updated in synchronization with internal clock signal intCLK and refresh addresses QA[1] to QA[NREF] are successively generated.

During the refresh operation, refresh is performed in memory array 15 shown in FIG. 2 in a burst manner. In a burst refresh mode in which refresh is performed in a burst manner, refresh of memory cell data in a memory space of a predetermined size (for example, entire memory space) is performed. Here, the number of refresh cycles is assumed to be NREF. The number of refresh cycles NREF is equal to the total number of word lines NWL, provided that word line WL is selected one by one to perform the refresh operation of the total number of word lines NWL arranged in the memory array. Where sub array blocks MA0 to MAk in memory array 15 are divided into two independent memory blocks, one word line WL is selected in each memory block, that is, the total of two word lines are selected, and refresh is performed in parallel. In this case, the number of refresh cycles NREF is NWL/2. The term "independent memory block" is used to mean a memory block at least allowing independent row selection operation. Therefore, if the memory array is divided into K independent memory blocks, the number of refresh cycles NREF is given by NWL/K.

When the clock cycles corresponding to the number of refresh cycles NREF have elapsed since assertion of self-refresh instruction signal /SREF and the refresh operation of the entire memory space is completed, self-refresh instruction signal /SREF is negated in a cycle Tn of external clock signal CLK. In accordance with negation of self-refresh instruction signal /SREF, power supply cut-off instruction signal /PCUT is asserted, and MOS transistor NQ20 is set to the OFF state in high-voltage power supply control circuit 75 shown in FIG. 14. Thus, local ground line 77 and global ground line 72 are isolated from each other. Power supply control circuit 35 shown in FIG. 2 is still performing an internal voltage generation operation, but word line drivers WV0 to WVm shown in FIG. 14 are in the stand-by state. In addition, in negative voltage setting circuit 70, as shown in FIG. 9, local negative voltage line 71 and global negative voltage line 69 are isolated from each other (block selection signal RBS is at L level indicating the non-selected state). Therefore, in this state, in the DRAM core, a path through which the current flows from word lines WL<0> to WL<m> through word line drivers WV0 to WVm to the negative voltage node is cut off.

In response to negation of self-refresh instruction signal /SREF, power supply equalization instruction signal /PEQ is then asserted in the form of a one-shot pulse. In response, MOS transistors PQ20 and PQ21 shown in FIG. 14 are set to the ON state and local high voltage line 67 is electrically connected to local negative voltage line 71 and local ground line 77. At this time, the VPP generation circuit within the voltage control portion is supplied with the power supply voltage and generates high voltage VPP, and local negative voltage line 71 and local ground line 77 are charged to the high voltage VPP level. As shown in FIG. 9, in negative voltage setting circuit 70, clamping MOS transistor NQ4 is provided between local negative voltage line 71 and local ground line 77. When block selection signal RBS is inactivated, MOS transistor NQ3 is maintained at the OFF state in accordance with the voltage on global negative voltage line 69, and global negative voltage line 69 and local negative voltage line 71 are also isolated from each other. Therefore, in this state, local high voltage line 67 is supplied with high voltage VPP from power supply control circuit 35 shown in FIG. 2, and the voltage levels of these local high voltage line 67, local ground line 77 and local negative voltage line 71 are all set to the same high voltage VPP level. Thus, leakage of electric charges from the high voltage node to the negative voltage node in word line driver WV is suppressed.

When equalization of the voltages on local high voltage line 67, local negative voltage line 71 and local ground line 77 is completed, wake-up signal ALIVE is negated in a cycle Tn+1 of external clock signal CLK. Thus, power supply control circuit 35 shown in FIG. 2 stops generation of the internal voltage. High voltage VPP and negative voltage VBB are generated by a charge pump circuit including the capacitor. Therefore, the output portion of the circuit generating these voltages VPP and VBB is normally in a high impedance state while the operation to generate a voltage is stopped. Accordingly, the voltage levels of high voltage VPP on local high voltage line 67 and negative voltage VBB on global negative voltage line 69 are substantially maintained also in the stand-by state.

When supply of the power supply voltage is stopped in power supply control circuit 35, power supply ready signal PWR_RDY from level detection circuit 13 is negated. As power supply to power supply control circuit 35 is stopped in accordance with negation of wake-up signal ALIVE, refresh clock generation circuit 12 also stops the operation and refresh clock PHY is not issued.

When a period defined by refresh time period tREF has elapsed since negation of self-refresh instruction signal /SREF, wake-up signal ALIVE is asserted at the start of a cycle Tm+1 of external clock signal CLK. In response to assertion of wake-up signal ALIVE, power supply control circuit 35 causes each internal power supply voltage (internal voltage) to return to a normal voltage level at a fast timing.

With the assertion of wake-up signal ALIVE, power supply cut-off instruction signal /PCUT is first negated, MOS transistor NQ20 shown in FIG. 14 is set to the ON state, and global ground line 72 and local ground line 77 are electrically connected with each other. When local ground line 77 is electrically connected to global ground line 72 and the voltage level thereof lowers, the clamping transistor is rendered conductive in negative voltage setting circuit 70 shown in FIG. 9 to quickly lower the voltage level of voltage VNEGB on local negative voltage line 71. Therefore, when power supply cut-off instruction signal /PCUT is negated, the voltage level of each voltage line is driven to a predetermined value and thereafter power supply ready signal PWR_RDY is asserted.

In a cycle T1 of clock signal CLK, power supply ready signal PWR_RDY from level detection circuit 13 is asserted, and self-refresh instruction signal /SREF is again asserted. When self-refresh instruction signal /SREF is asserted, refresh clock generation circuit 12 is supplied with the operating power supply voltage, and performs a generation operation and issues refresh clock PHY in predetermined cycles. Thus, the refresh clock is issued from cycle T1 of external clock signal CLK, and in cycle Ta1 . . . of the refresh clock, refresh is performed again in the burst mode in accordance with internal clock signal intCLK.

Each period PA to PD shown in FIG. 15 in the stand-by mode satisfies the following conditions:

PA+PB+PC+PD≦tREF,

PA: refresh clock PHY cycle×NREF,

PB: a period required from completion of the refresh operation until negation of wake-up signal ALIVE and cut-off of the power supply in the power supply control circuit, PC: a period from negation of wake-up signal ALIVE until next assertion thereof PD: a period from assertion of wake-up signal ALIVE until recovery of the internal voltage of the power supply control circuit to a predetermined voltage level and execution of next refresh.

Period PC ends when a count value obtained by counting external clock signal CLK attains to a predetermined value. The value for count-up is set based on refresh time period tREF.

The period during which power supply equalization instruction signal /PEQ is asserted is a period required for charging local high voltage line 67, local negative voltage line 71 and local ground line 77 with the circuit generating high voltage VPP.

Assuming that the number of refresh cycles NREF is 512 and a cycle of refresh clock PHY is 15 ns, for a memory array allowing the refresh in a refresh time period tREF of 10 ms, the period PA is calculated to be 7.68 μs. Therefore, during refresh time period tREF=10 ms, the refresh operation is performed for a time period of 7.68 μs and power supply of power supply control circuit 35 is cut off during a remaining period of 9.99 ms−(α1+α2). These parameters α1 and α2 correspond to duration lengths of periods PB and PD, respectively.

Period PB is a period from completion of the refresh operation until negation of wake-up signal ALIVE before power supply control circuit 35 enters the power down mode. Period PD is a period from assertion of wake-up signal ALIVE until recovery of power supply control circuit 35 to an original state and execution of refresh. These periods PB and PD can be realized in the nano-seconds order. In addition, the period during which power supply equalization instruction signal /PEQ is asserted is also sufficiently shorter than period PD and can be realized in the order of nano-seconds. Thus, the local ground line and the local negative voltage line can be charged to the high voltage VPP level within the period PB.

Therefore, during the period of refresh time period tREF, the period during which the DRAM core operates for refresh is very short, and for most of the time, the DRAM core is in the stand-by state and supply of the power supply voltage is stopped. Therefore, in this stand-by mode, current consumption can significantly be reduced. In addition, as deterioration of the data hold characteristics of the memory cells is suppressed, it is not necessary to set a long refresh time period and current consumption in the stand-by mode can be reduced without deterioration of the data hold characteristics.

In the event that a period during which power supply equalization instruction signal /PEQ is asserted is longer than period PB, such event can be addressed simply by delaying the timing of negation of wake-up signal ALIVE by a period of a predetermined number of clock cycles.

Figure 16:
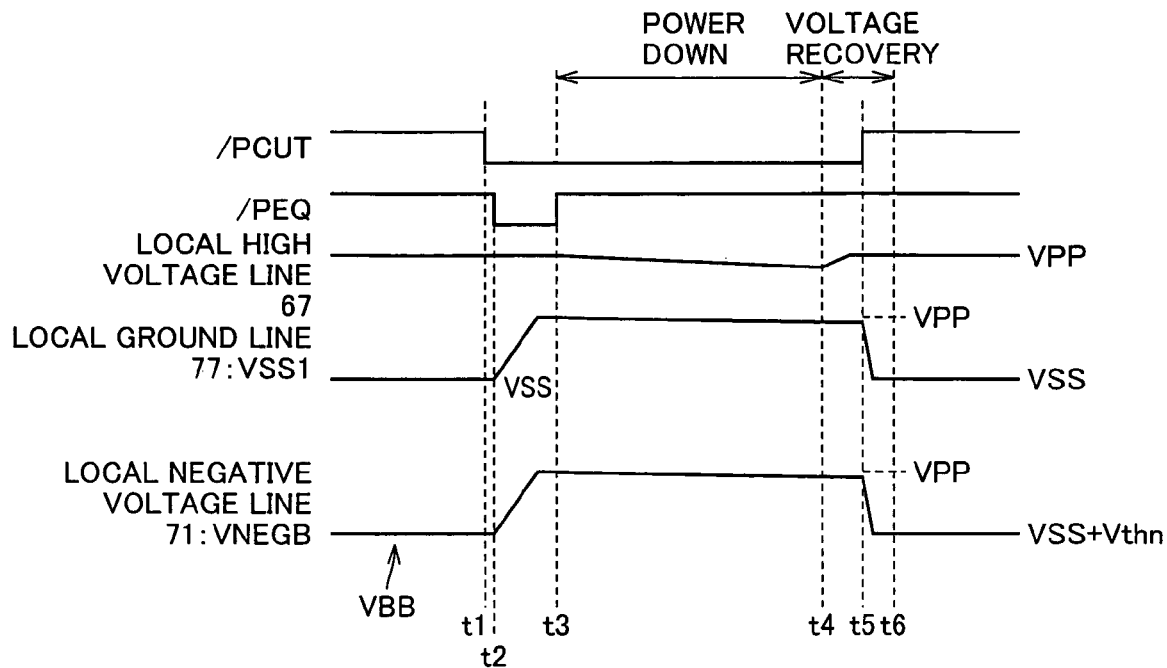
FIG. 16 shows a voltage change of each signal line during a stand-by cycle in the semiconductor memory device in the first embodiment of the present invention.

FIG. 16 schematically shows variation of the voltages during power down of local high voltage line 67, local ground line 77 and local negative voltage line 71 shown in FIG. 14. Variation in the voltages on these power supply lines will be described below with reference to FIG. 16.

After refresh of the entire memory space is completed, power supply cut-off instruction signal /PCUT is negated at time t1 in accordance with negation of self-refresh instruction signal /SREF, and local ground line 77 is isolated from global ground line 72. The DRAM core is in the stand-by state (stand-by cycle), and local negative voltage line 71 is isolated from global negative voltage line 69 in negative voltage setting circuit 70.

Power supply equalization instruction signal /PEQ is asserted at time t2. In response, local high voltage line 67, local ground line 77 and local negative voltage line 71 are electrically connected to each other, and voltage VSS1 on local ground line 77 and negative voltage VNEGB on local negative voltage line 71 are raised to the high voltage VPP level.

When the voltage level of local ground line 77 and local negative voltage line 71 is stabilized at the high voltage VPP level at time t3, power supply equalization instruction signal /PEQ is negated. Then, wake-up signal ALIVE is negated and supply of the power supply voltage is stopped. During this period, the voltage level of local high voltage line 67, local ground line 77 and local negative voltage line 71 is slightly lowered due to the leakage current. Leakage of electric charges on local high voltage line 67 to local ground line 77 and local negative voltage line 71 is sufficiently suppressed and lowering of the high voltage VPP level is also sufficiently suppressed.

After the power down cycle is completed, wake-up signal ALIVE not-shown is asserted at time t4, a voltage recovery operation is performed, and the voltage of local negative voltage line 71 is lowered. At this time, local ground line 77 is still isolated from the global ground line and has the voltage level not lowered.

Thereafter, power supply cut-off instruction signal /PCUT is negated at time t5. In response, local ground line 77 is electrically connected to the global ground line, and has the voltage level lowered. Local negative voltage line 71 is isolated from the global negative voltage line by the negative voltage setting circuit. Local negative voltage line 71, however, is discharged by negative voltage setting circuit 70 through the clamping transistor (NQ4), and has the voltage level lowered. During stand-by, block selection signal RBS indicates the non-selected state, and the voltage level of local negative voltage line 71 is clamped to a level not higher than voltage VSS+Vthn by clamping N-channel MOS transistor NQ4.

When each voltage is recovered to a predetermined voltage level at time t6, power supply ready signal PWR_RDY is asserted. In response to assertion of power supply ready signal PWR_RDY, self-refresh instruction signal /SREF is asserted.

Figure 17:
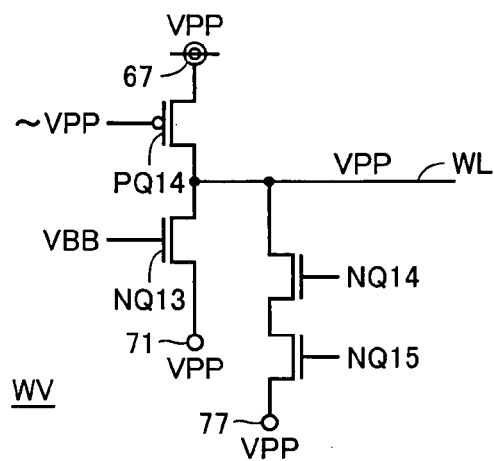
FIG. 17 shows a voltage of each voltage line in a word line driver in the first embodiment of the present invention.

FIG. 17 shows a voltage at each node of word line driver WV during the stand-by state in the power down mode. FIG. 17 shows a configuration of the output portion of the word line driver shown in FIG. 10 as word line driver WV. In FIG. 17, word line WL is maintained at the high voltage VPP level. The source node of MOS transistor PQ14, that is, local high voltage line 67, is at the high voltage VPP level. The source node of MOS transistor NQ13, that is, local negative voltage line 71, is at the high voltage VPP level. The source node of MOS transistor NQ15, that is, the voltage of local ground line 77, is also at the high voltage VPP level. Therefore, as word line WL, local ground line 77 and local negative voltage line 71 are set to the same voltage level, there is no path through which the leakage current flows and leakage of electric charges does not take place. Thus, word line WL can be maintained at the high voltage VPP level in the stand-by state. In response, the access transistor in the memory cell can be maintained at the OFF state and the storage data can reliably be held.

Figure 18:
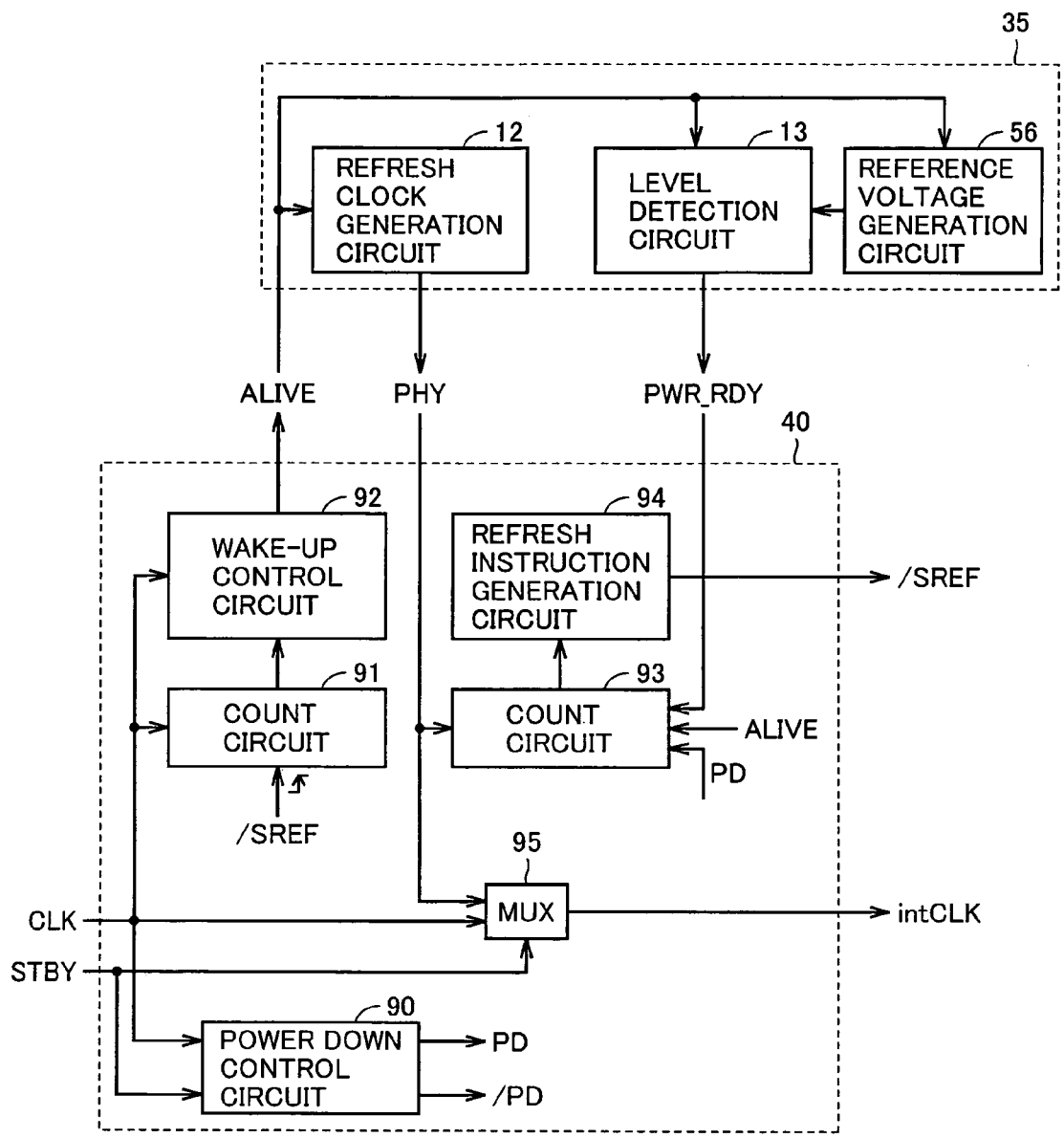
FIG. 18 schematically shows a configuration of a main portion of a voltage management portion and a power supply control circuit of the semiconductor memory device according to the first embodiment of the present invention.

FIG. 18 schematically shows a configuration of power management portion 40 shown in FIG. 2. FIG. 18 also shows a configuration of a main portion of power supply control circuit 35.

In FIG. 18, power management portion 40 includes a power down control circuit 90 for generating power down instruction signals PD and /PD in accordance with external clock signal CLK and stand-by mode instruction signal STBY, a count circuit 91 for counting external clock signal CLK in response to negation of self-refresh mode instruction signal /SREF, and a wake-up control circuit 92 for generating wake-up signal ALIVE in accordance with a count of count circuit 91.

When stand-by mode instruction signal STBY is asserted, power down control circuit 90 asserts power down instruction signals PD and /PD in synchronization with external clock signal CLK after elapse of one clock cycle.

When self-refresh mode instruction signal /SREF is negated, count circuit 91 has the count set to an initial value, and counts external clock signal CLK. When count circuit 91 counts up the count value determined based on refresh time period tREF, count circuit 91 generates a count-up indication signal.

When the count of count circuit 91 is reset to the initial value, wake-up control circuit 92 asserts wake-up signal ALIVE in synchronization with the next rise of clock signal CLK. When the count of count circuit 91 attains to a predetermined value, wake-up control circuit 92 negates wake-up signal ALIVE in synchronization with external clock signal CLK.

Power management portion 40 further includes a count circuit 93 and a refresh instruction generation circuit 94, in order to generate self-refresh mode instruction signal /SREF. When power down instruction signal PD, wake-up signal ALIVE and power supply ready signal PWR_RDY from level detection circuit 13 included in power supply control circuit 35 are all asserted, count circuit 93 counts refresh clock PHY. Specifically, when the power down mode is designated, wake-up signal ALIVE is asserted to cause power supply control circuit 35 to generate a stable internal voltage, and power supply ready signal PWR_RDY from level detection circuit 13 is asserted, count circuit 93 counts refresh clock PHY.

Refresh instruction generation circuit 94 generates self-refresh mode instruction signal /SREF in accordance with the count of count circuit 93. Specifically, when the count of count circuit 93 is reset to the initial value, refresh instruction generation circuit 94 asserts self-refresh mode instruction signal /SREF. When the count of count circuit 93 attains to the number of refresh cycles NREF, refresh instruction generation circuit 94 negates self-refresh mode instruction signal /SREF.

Power management portion 40 further includes a multiplexer (MUX) 95 for selecting one of refresh clock PHY and external clock signal CLK to generate internal clock signal intCLK in accordance with stand-by mode instruction signal STBY. Multiplexer 95 selects refresh clock PHY from refresh clock generation circuit 12 when stand-by mode instruction signal STBY is asserted and the low current consumption stand-by mode is to be designated. When stand-by mode instruction signal STBY is negated, multiplexer 95 selects external clock signal CLK.

In power supply control circuit 35, supply of power supply voltage VDD to refresh clock generation circuit 12 and reference voltage generation circuit 56 is controlled in accordance with wake-up signal ALIVE. Level detection circuit 13 operates only during a period in which wake-up signal ALIVE is asserted. Level detection circuit 13 determines whether the internal power supply voltage attains to a predetermined voltage level, and generates power supply ready signal PWR_RDY based on the result of determination.

By utilizing power management portion 40 shown in FIG. 18, the following sequence can be implemented. Specifically, when the stand-by mode is designated, self-refresh mode instruction signal /SREF is asserted as many times as the number of refresh cycles. After self-refresh (burst refresh) is completed, wake-up signal ALIVE is negated and wake-up signal ALIVE is then asserted.

The reason why wake-up signal ALIVE is applied to refresh clock generation circuit 12 and reference voltage generation circuit 56 in FIG. 18 is to indicate that power supply to these circuits 12 and 56 is controlled in accordance with wake-up signal ALIVE.

Figure 19:
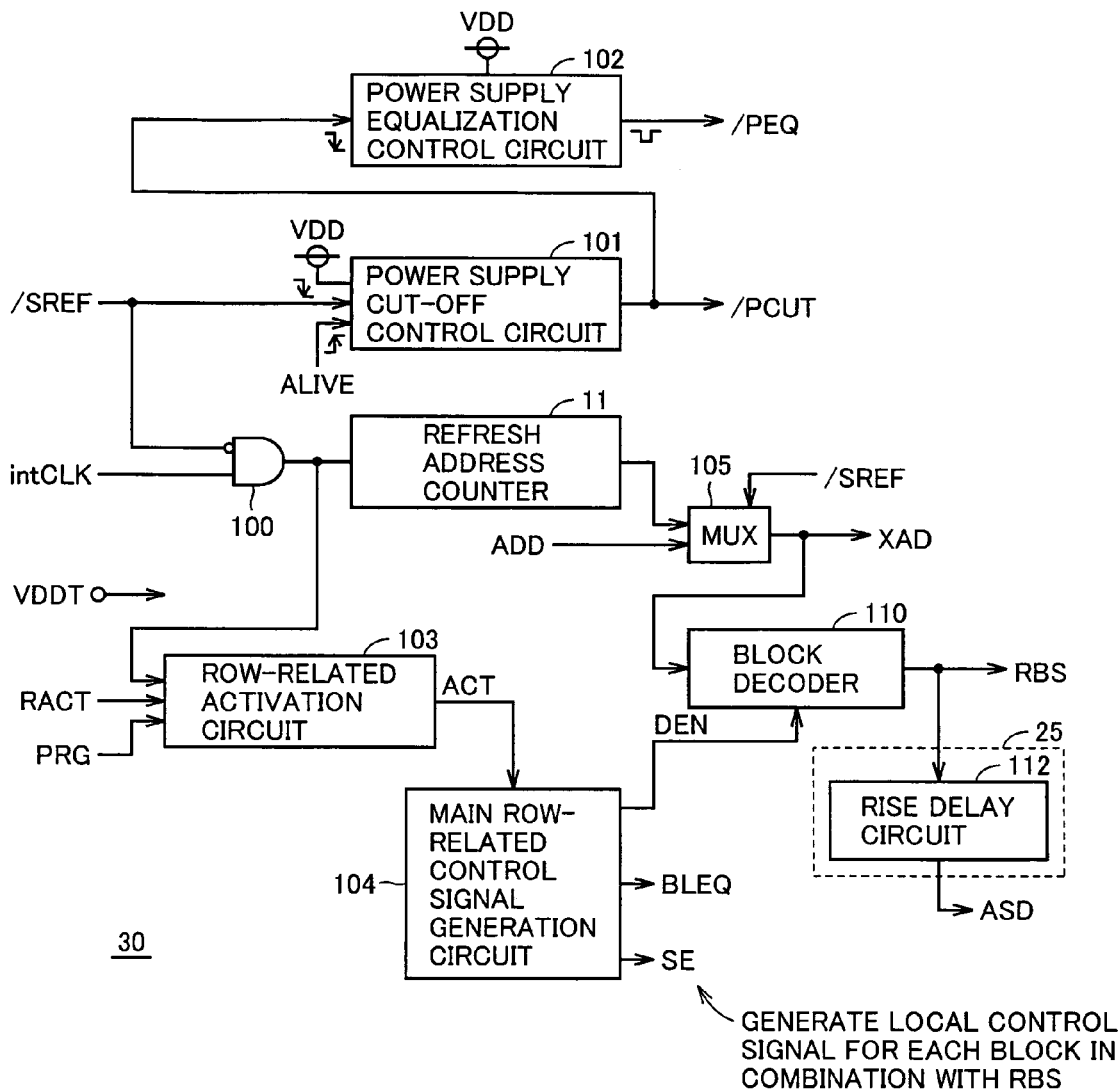
FIG. 19 schematically shows a configuration of a control portion of the semiconductor memory device according to the first embodiment of the present invention.

FIG. 19 schematically shows a configuration of a portion related to row selection, in control portion 30 in the DRAM core shown in FIG. 2. In FIG. 19, control portion 30 includes a gate circuit 100 receiving self-refresh mode instruction signal /SREF and internal clock signal intCLK, a power supply cut-off control circuit 101 for generating power supply cut-off instruction signal /PCUT in accordance with self-refresh mode instruction signal /SREF, a power supply equalization control circuit 102 for asserting power supply equalization instruction signal /PEQ in response to power supply cut-off instruction signal /PCUT, and a row-related activation circuit 103 for generating an internal operation activation signal ACT in accordance with an output signal from gate circuit 100, a row access command RACT from an external logic and a precharge instruction signal PRG.

Gate circuit 100 is enabled when self-refresh mode instruction signal /SREF is asserted and transmits internal clock signal intCLK. Gate circuit 100 generates a fixed signal of L level when in disable state.

Power supply cut-off control circuit 101 asserts power supply cut-off instruction signal /PCUT when self-refresh mode instruction signal /SREF is negated, and negates power supply cut-off instruction signal /PCUT when wake-up signal ALIVE is asserted.

Power supply equalization control circuit 102 maintains power supply equalization instruction signal /PEQ in the asserted state for a predetermined time period in accordance with assertion of power supply cut-off instruction signal /PCUT. Wake-up signal ALIVE may be negated in synchronization with clock signal CLK, in response to transition to assertion of power supply equalization instruction signal /PEQ.

When row access command RACT is activated in the normal operation mode, row-related activation circuit 103 maintains internal operation activation signal ACT in the asserted state until precharge command PRG is supplied. In addition, when the output signal from gate circuit 100 is asserted, row-related activation circuit 103 maintains internal operation activation signal ACT in the asserted state for a predetermined period of time. Therefore, row-related activation circuit 103 is constituted, for example, of a flip-flop set in accordance with assertion of row access command RACT and reset in accordance with assertion of precharge command PRG, a one-shot pulse generation circuit generating a pulse signal having a predetermined width of time in response to rise of the output signal from gate circuit 100, and a gate circuit taking a logical sum of the output signals from these circuits and generating internal operation activation signal ACT.

Refresh address counter 11 included in control portion 30 updates the count in accordance with assertion of the output signal from gate circuit 100 and generates the refresh address.

Control portion 30 further includes a main row-related control signal generation circuit 104 for generating a control signal related to row selection in accordance with internal operation activation signal ACT from row-related activation circuit 103, a multiplexer (MUX) 105 for selecting one of the refresh address from refresh address counter 11 and external address signal ADD in accordance with self-refresh mode instruction signal /SREF, and a block decoder 110 for decoding a block address signal from multiplexer 105 in accordance with a decoder enable signal DEN from main row-related control signal generation circuit 104, to generate a row block selection signal RBS.

Main row-related control signal generation circuit 104 asserts/negates main control signals such as bit line equalization instruction signal BLEQ, decoder enable signal DEN, and sense amplifier activation signal SE in a predetermined sequence, in common to sub blocks included in the memory array. In each sub block in the memory array, the block selection operation is performed in accordance with block selection signal RBS and these main control signals DEN, BLEQ and SE. When block selection signal RBS indicates the non-selected state, the non-selected sub block maintains the stand-by state.

In array drive control portion 25, a rise delay circuit 112 is provided corresponding to each sub block. When block selection signal RBS for the corresponding sub block is asserted, rise delay circuit 112 asserts word line drive timing signal ASD with the timing of such assertion being delayed.

Figure 20:
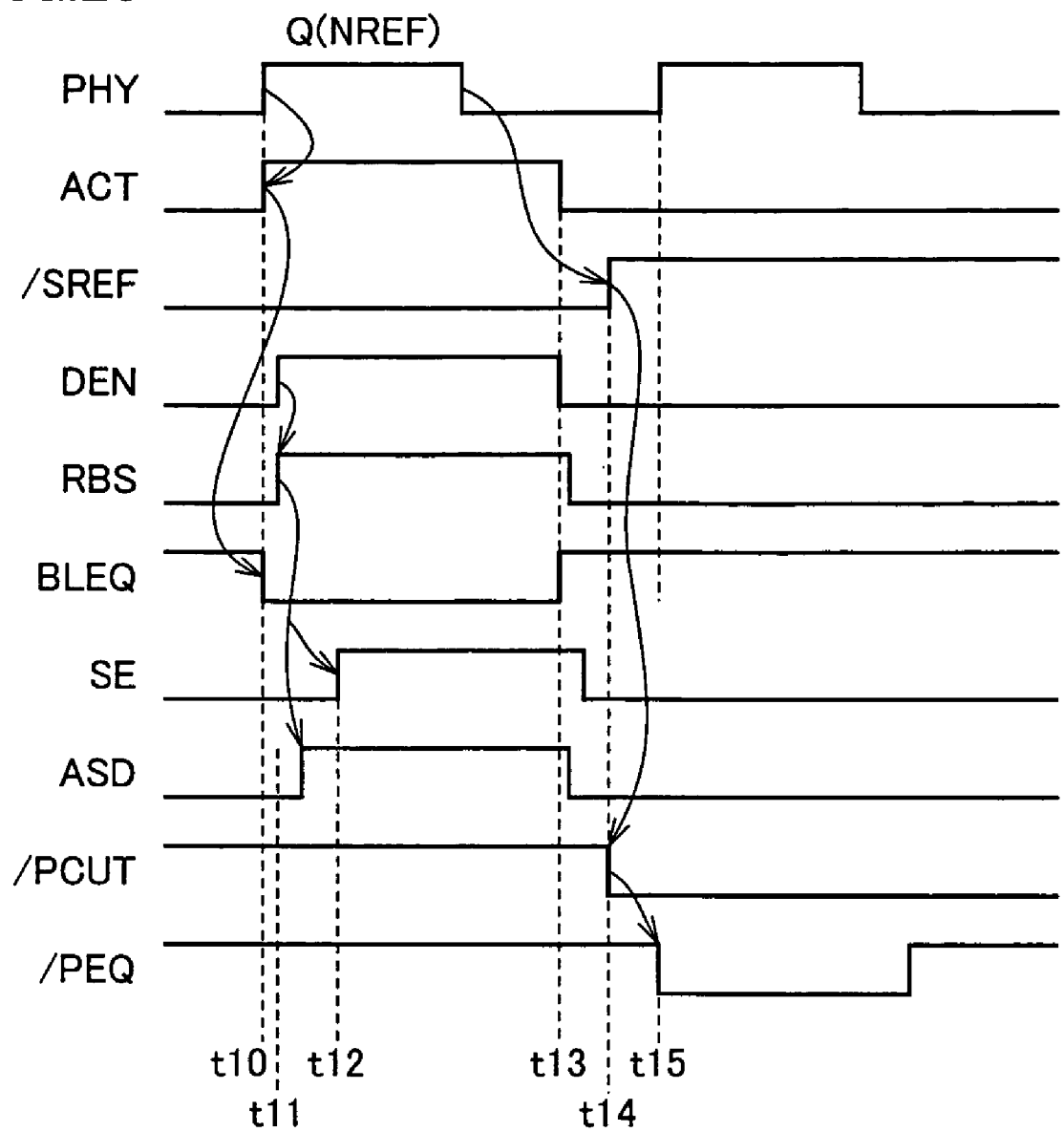
FIG. 20 is a timing chart representing an operation of the control portion shown in FIG. 19.

FIG. 20 is a timing chart representing an operation of control portion 30 shown in FIG. 19 in transition from the refresh period to the stand-by cycle. An operation of control portion 30 shown in FIG. 19 will briefly be described below with reference to FIG. 20.

At time t10, refresh of a last refresh address Q (NREF) is started. Internal clock signal intCLK is generated in accordance with refresh clock PHY, and the output signal of gate circuit 100 falls. In response, row-related activation circuit 103 asserts internal operation activation signal ACT for a predetermined period. In accordance with assertion of internal operation activation signal ACT, main row-related control signal generation circuit 104 negates bit line equalization instruction signal BLEQ and then asserts decoder enable signal DEN. In response to assertion of decoder enable signal DEN, block decoder 110 performs a decoding operation and asserts block selection signal RBS for the addressed sub block. In the selected sub block, word line drive timing signal ASD is asserted in accordance with the output signal from rise delay circuit 112.

When the memory cell data are read onto the bit lines in the selected sub block, sense amplifier activation signal SE is asserted at time t12, and sensing, amplification and re-writing (restoring) of the memory cell data is performed.

After a predetermined period elapses, internal operation activation signal ACT is negated at time t13 and decoder enable signal DEN is negated. In addition, bit line equalization instruction signal BLEQ is asserted. Thus, block selection signal RBS and word line drive timing signal ASD are negated and the memory array returns to the stand-by state.

In response to fall of refresh clock PHY, self-refresh instruction signal /SREF is negated at time t14 after internal operation activation signal ACT is negated. In accordance with negation of self-refresh instruction signal /SREF, power supply cut-off control circuit 101 asserts power supply cut-off instruction signal /PCUT. Thereafter, in accordance with assertion of power supply cut-off instruction signal /PCUT, power supply equalization control circuit 102 asserts power supply equalization instruction signal /PEQ for a predetermined period from time t15. Relation between the timing of assertion of power supply equalization instruction signal /PEQ and the timing of refresh clock PHY is not particularly defined. It is sufficient to negate power supply equalization instruction signal /PEQ before negation of wake-up signal ALIVE for cutting off the power supply.

It is noted that bit line equalization instruction signal BLEQ may be asserted/negated in each sub block in accordance with block selection signal RBS. In addition, block decoder 110 may be provided corresponding to each sub block (that is, block decoder 110 may be provided for each sub array block in array drive control portion 25).

Here, power supply cut-off instruction signal /PCUT is negated in accordance with assertion of wake-up signal ALIVE in power supply cut-off control circuit 101.

As described above, according to the first embodiment of the present invention, during the stand-by cycle in the power down mode in which power supply is cut off, before the power supply is cut off, the local ground line and the local negative voltage line are isolated from the global ground line and the global negative voltage line, respectively, and are supplied with the high voltage from the local high voltage line to be equalized in voltage with each other. In the word line driver, as the voltages of the high-side power supply node and the low-side power supply node are set to the same voltage level, a path through which electric charges leak is cut off for any word line and the voltage level of the word line in the non-selected state can be prevented from lowering. Thus, an embedded DRAM capable of reliably maintaining the access transistor in the memory cell in a non-conductive state and suppressing leakage of electric charges even during power down as well as holding data in a stable manner with low power consumption can be achieved.

In other words, a period during which the DRAM core is in the stand-by state within refresh time period tREF can be close to a time period (9.99 ms) equal to refresh time period tREF (10 ms). Therefore, the memory array and the array peripheral circuitry perform the refresh operation for a period of 0.08% (7.68 is) of refresh time period tREF and power supply is cut off during the remaining 99.92% time period (9.99 ms). A ratio of the time period in which the current leakage path is cut off is dependent on the number of refresh cycles NREF, and the ratio is greater as the number of refresh cycles is smaller. Thus, the effect of reducing current consumption becomes greater. According to the present invention, lowering in the word line voltage is suppressed while power supply is cut off and deterioration of the charge holding characteristics of the memory cells is suppressed. Therefore, it is not necessary to shorten the refresh time period and a data hold stand-by current comparable to that in a so-called low-power consumption SRAM can be achieved.

Second Embodiment

Figure 21:
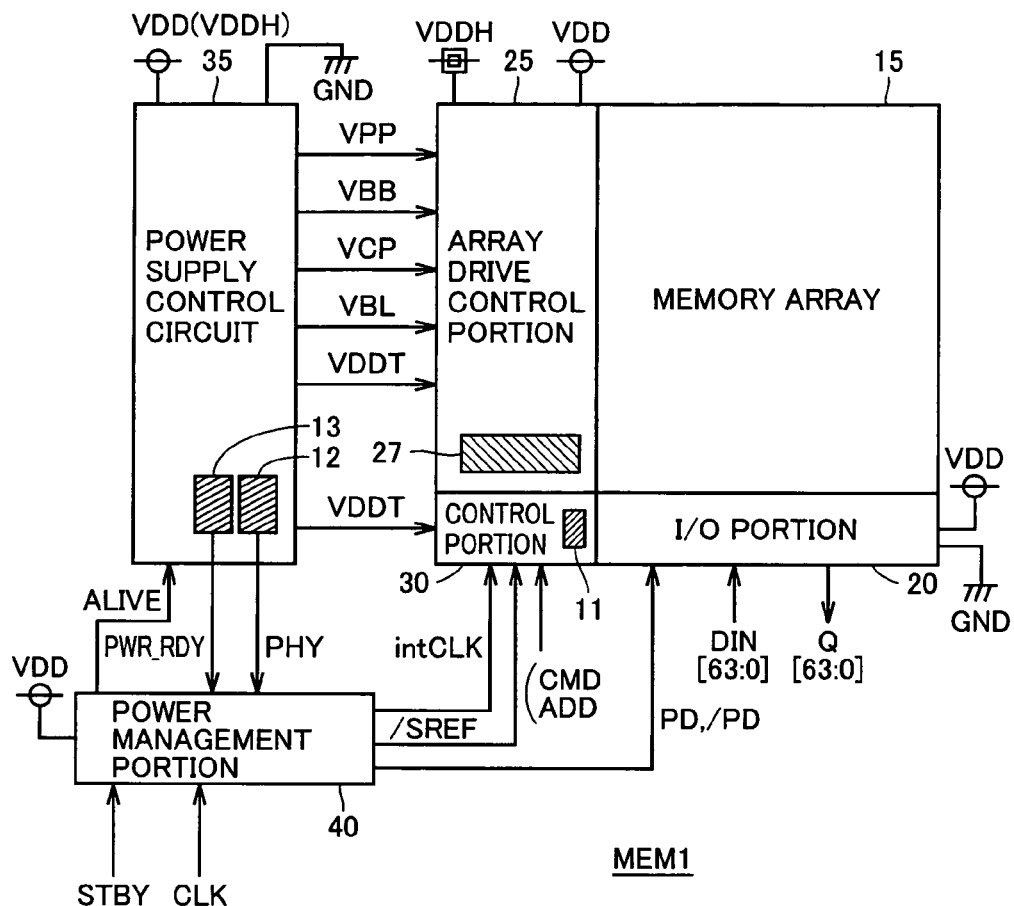
FIG. 21 schematically shows an overall configuration of a semiconductor memory device according to a second embodiment of the present invention.

FIG. 21 schematically shows an overall configuration of the memory circuit (DRAM core) according to the second embodiment of the present invention. DRAM core MEM1 shown in FIG. 21 is different from DRAM core MEM1 shown in FIG. 2 in the configuration in the following points. Specifically, external high-side power supply voltage VDDH is supplied to array drive control portion 25. High-side power supply voltage VDDH is a voltage higher than the voltage level of high voltage VPP. The configuration of the memory circuit shown in FIG. 21 is otherwise the same as that of the memory circuit shown in FIG. 2. Therefore, the corresponding components have the same reference characters allotted and detailed description thereof is not provided.

Figure 22:
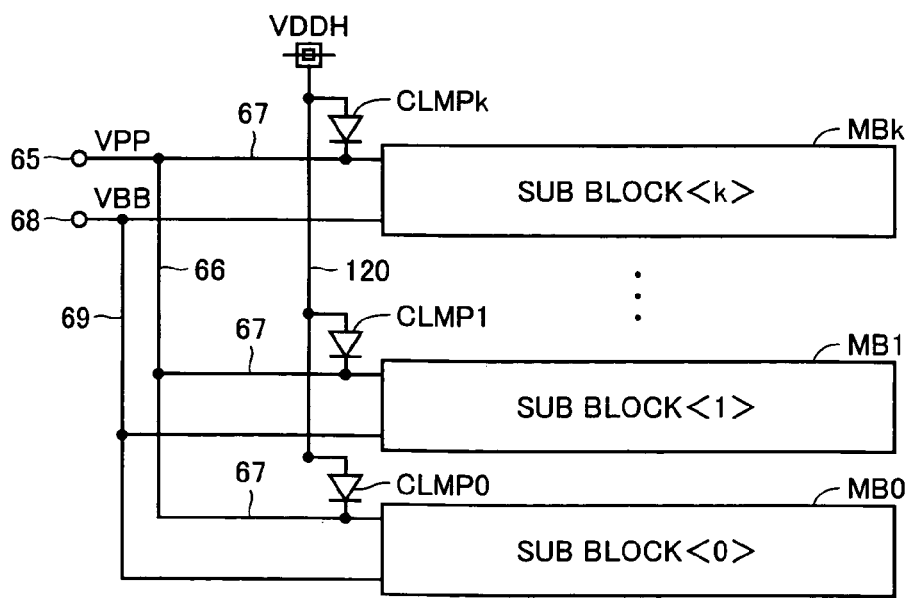
FIG. 22 schematically shows a configuration of a main portion of the semiconductor memory device according to the second embodiment of the present invention.

FIG. 22 schematically shows a configuration of power supply to the sub block in array drive control portion 25 shown in FIG. 21. In FIG. 22, a high-side main power supply line 120 is provided in common to sub blocks MB0 to MBk. High-side main power supply line 120 transmits external high-side power supply voltage VDDH. High-side main power supply line 120 is coupled to local high voltage line 67 provided for each of sub blocks MB0 to MBk through each of clamping elements CLMP0 to CLMPk. Local high voltage line 67 in each sub block is coupled in common to main high voltage line 66 transmitting high voltage VPP.

In addition, as in the configuration shown in FIG. 8, negative voltage VBB is transmitted to sub blocks MB0 to MBk through main negative voltage line 69. Clamping elements CLMP0 to CLMPk clamp a lower limit voltage of corresponding local high voltage line 67 to the level of a voltage VDDH−Vf. Here, Vf represents a forward voltage drop of clamping elements CLMP0 to CLMPk.

In the configuration shown in FIG. 22, clamping element CLMP is provided corresponding to each of sub blocks MB0 to MBk. Main high voltage line 66, however, may electrically be coupled to a power supply node supplying high-side power supply voltage VDDH through one clamping element CLMP.

Figure 23:
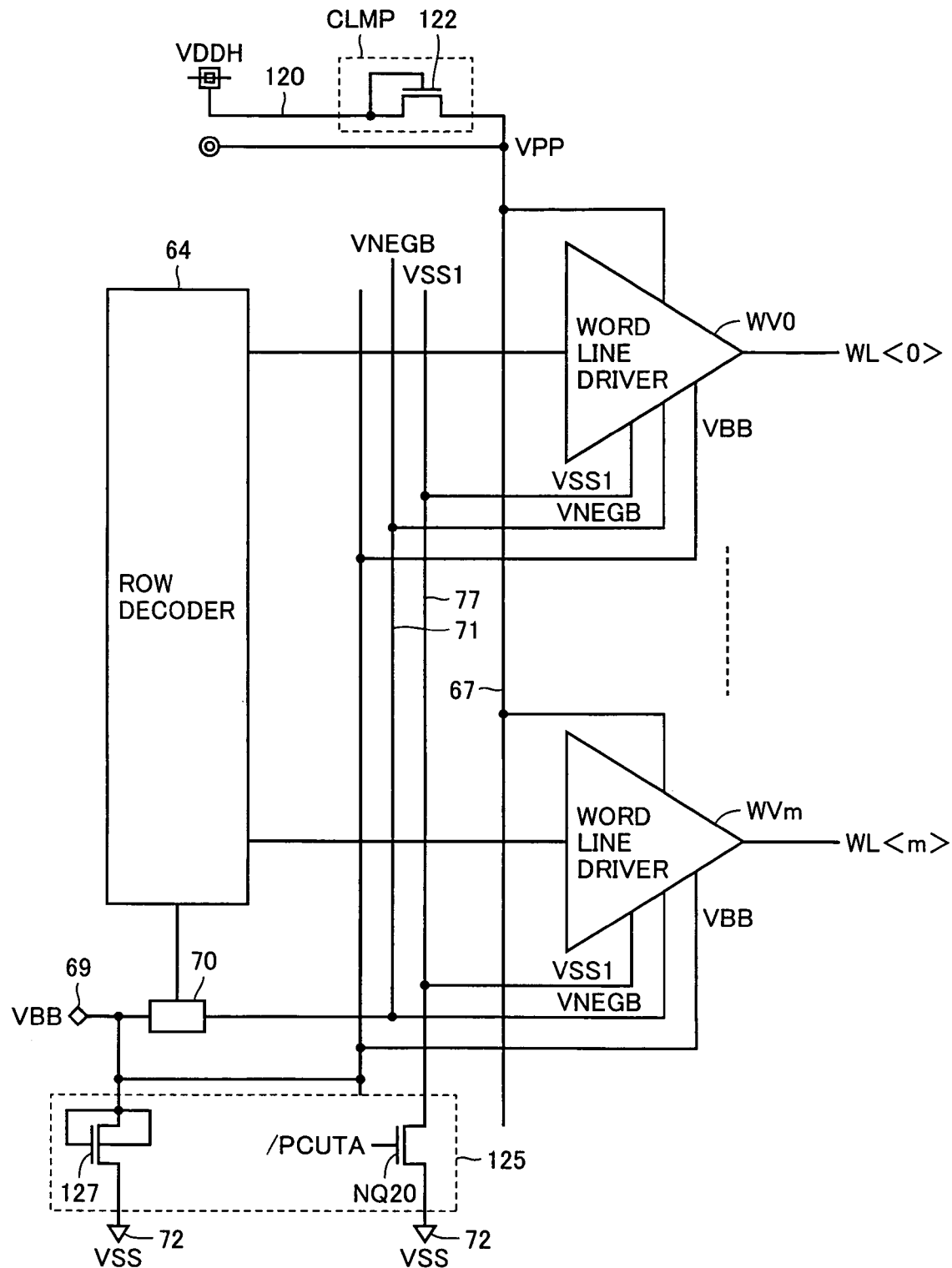
FIG. 23 shows a configuration of a voltage control portion according to the second embodiment of the present invention.

FIG. 23 schematically shows a configuration of the high-voltage power supply control circuit in one sub block. In FIG. 23, the high-voltage power supply control circuit provided for each sub block is comprised of clamping element CLMP and a low-side power supply control portion 125. Clamping element CLMP is configured with a diode-connected N-channel MOS transistor 122 and adjusted to such a size as supplying a current as much as the total leakage current amount of the voltage VPP in the sub block. Therefore, clamping element CLMP holds the level of the voltage VPP on local high voltage line 67 at a desired level.

Low-side power supply control portion 125 includes N-channel MOS transistor NQ20 responsive to a power supply cut-off instruction signal /PCUTA and a diode-connected N-channel MOS transistor 127 clamping the voltage of global negative voltage line 69. MOS transistor 127 is connected between global negative voltage line 69 and global ground line 72 and has the control gate and the backgate both coupled to global negative voltage line 69. Therefore, clamping MOS transistor 127 suppresses the voltage on global negative voltage line 69 to voltage VSS+Vthn or lower. Here, Vthn represents the threshold voltage of the MOS transistor 127.

Figure 24:
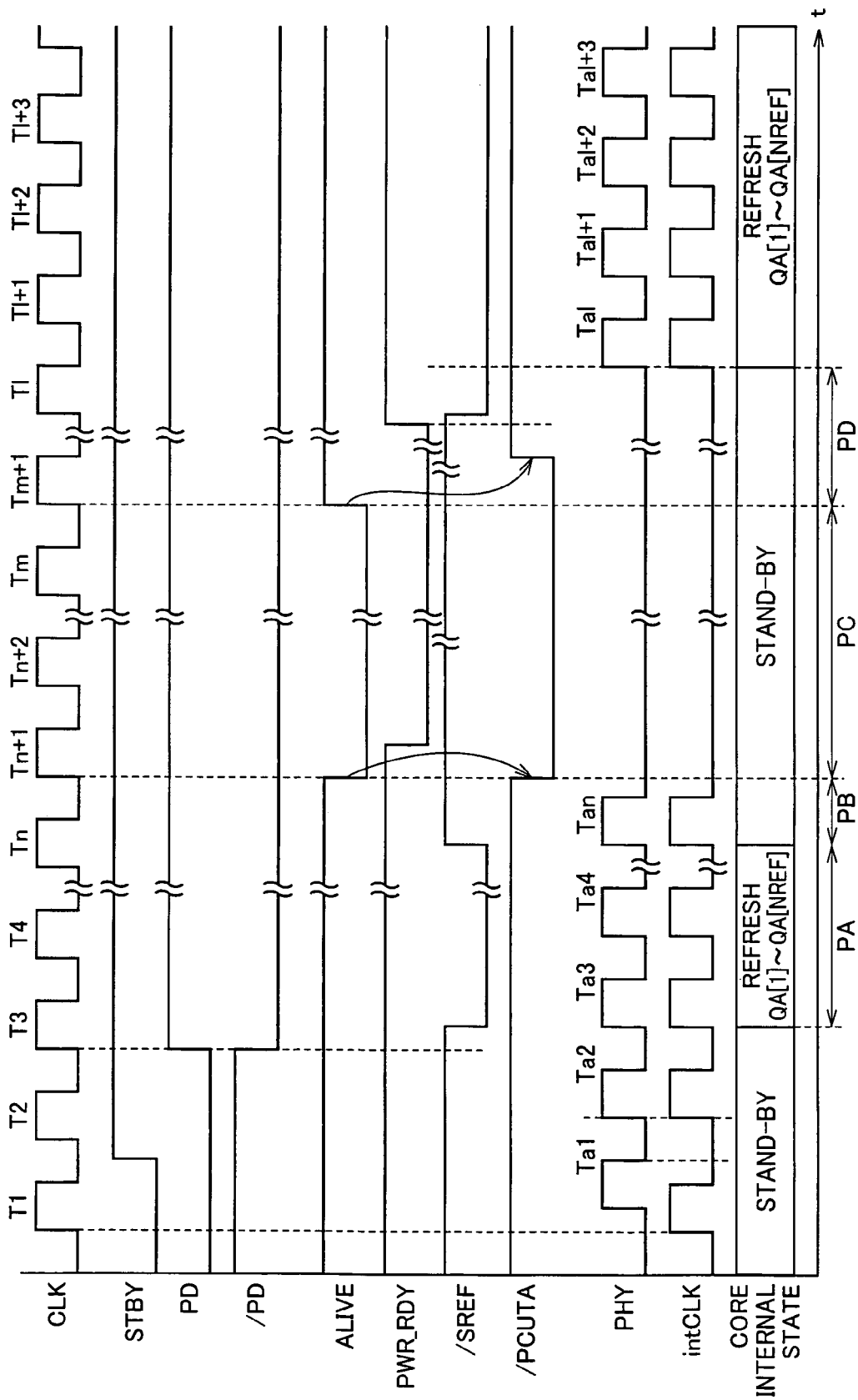
FIG. 24 is a signal waveform diagram representing an operation in a stand-by mode, of the semiconductor memory device according to the second embodiment of the present invention.

FIG. 24 is a timing chart representing an operation of the configuration shown in FIG. 23 in the stand-by mode. The operation of the power supply control portion shown in FIG. 2 will be described below with reference to FIG. 24. In FIG. 24, a portion corresponding to that in the operation timing chart in the first embodiment shown in FIG. 15 has the same reference character allotted and description thereof is not provided as appropriate.

In cycles T1 to Tn of external clock signal CLK, as in the timing chart shown in FIG. 15, refresh is performed in the burst mode in accordance with assertion of stand-by mode instruction signal STBY.

When self-refresh instruction signal /SREF is negated and the refresh period is completed, the DRAM core enters the stand-by state. In cycle Tn+1 of external clock signal CLK in the stand-by cycle, wake-up signal ALIVE is negated in synchronization with clock signal CLK and power supply control circuit 25 stops generation of the internal voltage.

In response to negation of wake-up signal ALIVE, power supply cut-off instruction signal /PCUTA is asserted. In low-side power supply control portion 125, MOS transistor NQ20 is set to the OFF state in accordance with assertion of power supply cut-off instruction signal /PCUTA, and local ground line 77 and global ground line 72 are isolated from each other. Thus, a path through which electric charges leak from local high voltage line 67 to global ground line 72 through word line drivers WV0 to WVm is cut off. In addition, even when the voltage level of local high voltage line 67 is lowered, such voltage lowering is sufficiently suppressed by the clamping function of clamping element CLMP and high voltage VPP on local high voltage line 67 can be maintained at a predetermined voltage level.

Further, even when supply of negative voltage VBB is stopped in accordance with negation of wake-up signal ALIVE and the voltage level of the negative voltage is raised, the increase in voltage level is restricted to a level not higher than VSS+Vthn by clamping transistor 127. Even if the voltage at the backgate of the MOS transistor in an output driving stage of the word line driver is raised, a voltage between the back gate and the source/drain of the MOS transistor is suppressed to a built-in voltage or lower of the PN junction and malfunction is reliably prevented.

As shown in FIG. 9, voltage VNEGB on local negative voltage line 71 is clamped to voltage VSS1+Vthn or lower by the clamping transistor (NQ4) in negative voltage setting circuit 70 and increase in voltage level is suppressed. PN junction between a P well of a substrate region and an N+ type impurity region of the source/drain of the N-channel MOS transistor of word line driver WV is prevented from being forward-biased and leakage of electric charges from the high-side power supply node to the low-side power supply node in the word line driver is prevented.

Therefore, during the stand-by state, leakage of electric charges charged in the memory cell capacitor can be suppressed to the minimum possible extent in word lines WL<0> to WL<m>. In addition, by compensating for leakage of electric charges in the word line through word line drivers WV0 to WVm by using clamping element CLMP, the voltage level of the word line in the stand-by state can be held at a voltage substantially close to the high voltage VPP level. Thus, even when supply of the internal voltage is cut off, storage data in the memory cell can reliably be held and deterioration of the data hold characteristics of the memory cell can be suppressed.

When the time determined based on refresh time period tREF elapses, wake-up signal ALIVE is asserted in cycle Tm+1 of external clock signal CLK and generation of the internal voltage is started in the power supply control circuit. In accordance with assertion of wake-up signal ALIVE, power supply cut-off instruction signal /PCUTA is negated and MOS transistor NQ20 is set to the ON state in low-side power supply control portion 125. In response, local ground line 77 is electrically connected to global ground line 72, and local ground voltage VSS1 is set to the ground voltage VSS level.

In addition, in negative voltage setting circuit 70, voltage VNEGB on local negative voltage line 71 is initialized in accordance with the voltage level of local ground line 77 by the clamping transistor (NQ4).

When the internal voltage (reference voltage) is subsequently stabilized, power supply ready signal PWR_RDY is asserted and thereafter, self-refresh instruction signal /SREF is asserted and refresh is performed as in the first embodiment.

Figure 25:
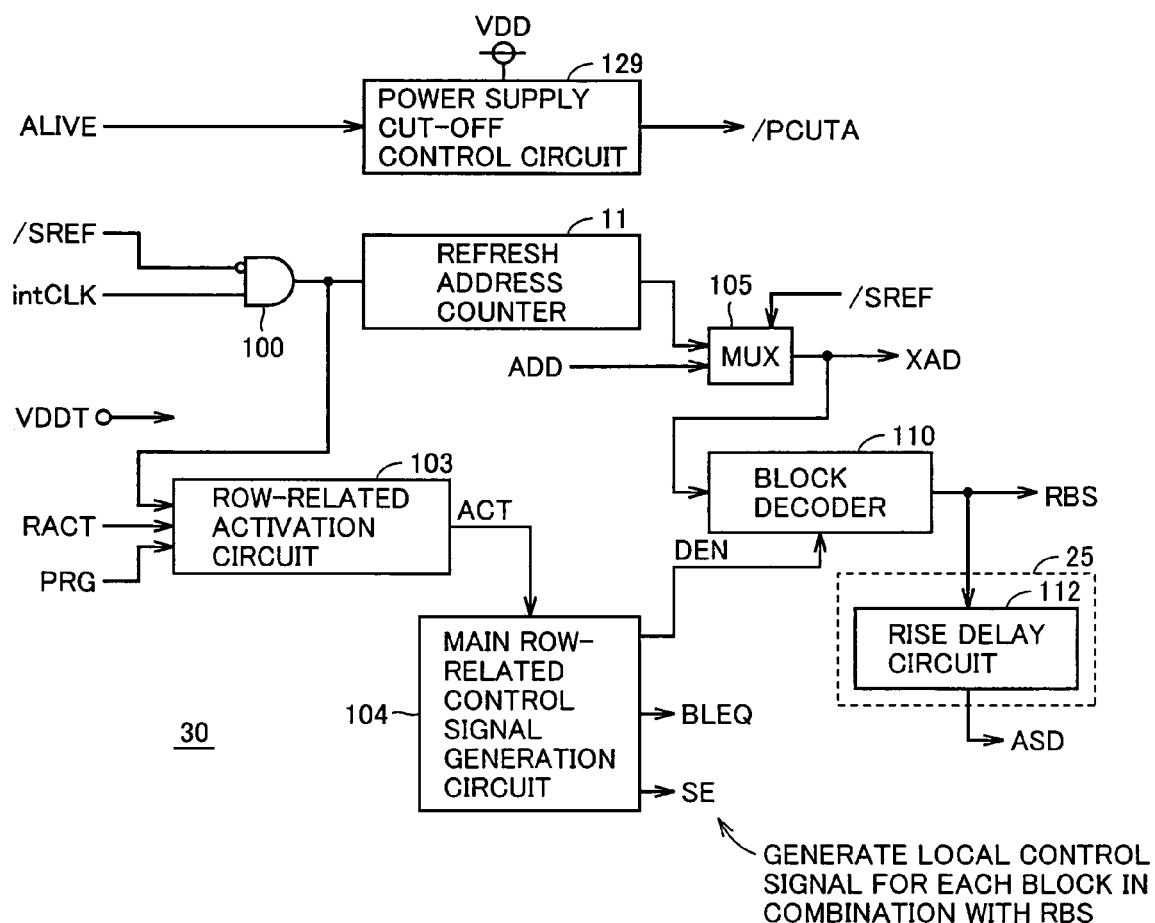
FIG. 25 schematically shows a configuration of a control portion of the semiconductor memory device according to the second embodiment of the present invention.

FIG. 25 schematically shows a configuration of control portion 30 in the DRAM core in the second embodiment of the present invention. The configuration of control portion 30 shown in FIG. 25 is different from the configuration of the control portion in the first embodiment shown in FIG. 19 in the following points. Specifically, power supply equalization control circuit 102 generating power supply equalization instruction signal /PEQ is not provided. A power supply cut-off control circuit 129 for generating power supply cut-off instruction signal /PCUTA asserts power supply cut-off instruction signal /PCUTA in response to negation of wake-up signal ALIVE and negates power supply cut-off instruction signal /PCUTA in response to assertion of wake-up signal ALIVE. While power supply is cut off, power supply cut-off instruction signal /PCUTA is maintained in the asserted state.

The configuration of control portion 30 shown in FIG. 25 is otherwise the same as that of control portion 30 shown in FIG. 19. Therefore, the corresponding portions have the same reference characters allotted and detailed description thereof is not provided.

It is noted that power supply cut-off instruction signal /PCUTA may be generated according to the configuration of the control portion similar to that in the first embodiment. In addition, the configuration the same as in the first embodiment is employed for the configuration of power management portion 40.

Here, the configuration utilizing clamping elements CLMP0 to CLMPk shown in FIG. 22 may be used in combination with the configuration of the high-voltage power supply control circuit shown in the first embodiment.

As described above, according to the second embodiment of the present invention, during the stand-by state in the stand-by mode, the local ground line is isolated from the global ground line, the lower limit of the voltage on the local high voltage line is clamped by the external power supply voltage, and the upper limit of the voltage on the global negative voltage line is clamped. Therefore, even when power supply is cut off in the stand-by cycle, the voltage of the word line can be maintained at the high voltage level and the memory cell data can be held in a stable manner.

Third Embodiment

Figure 26:
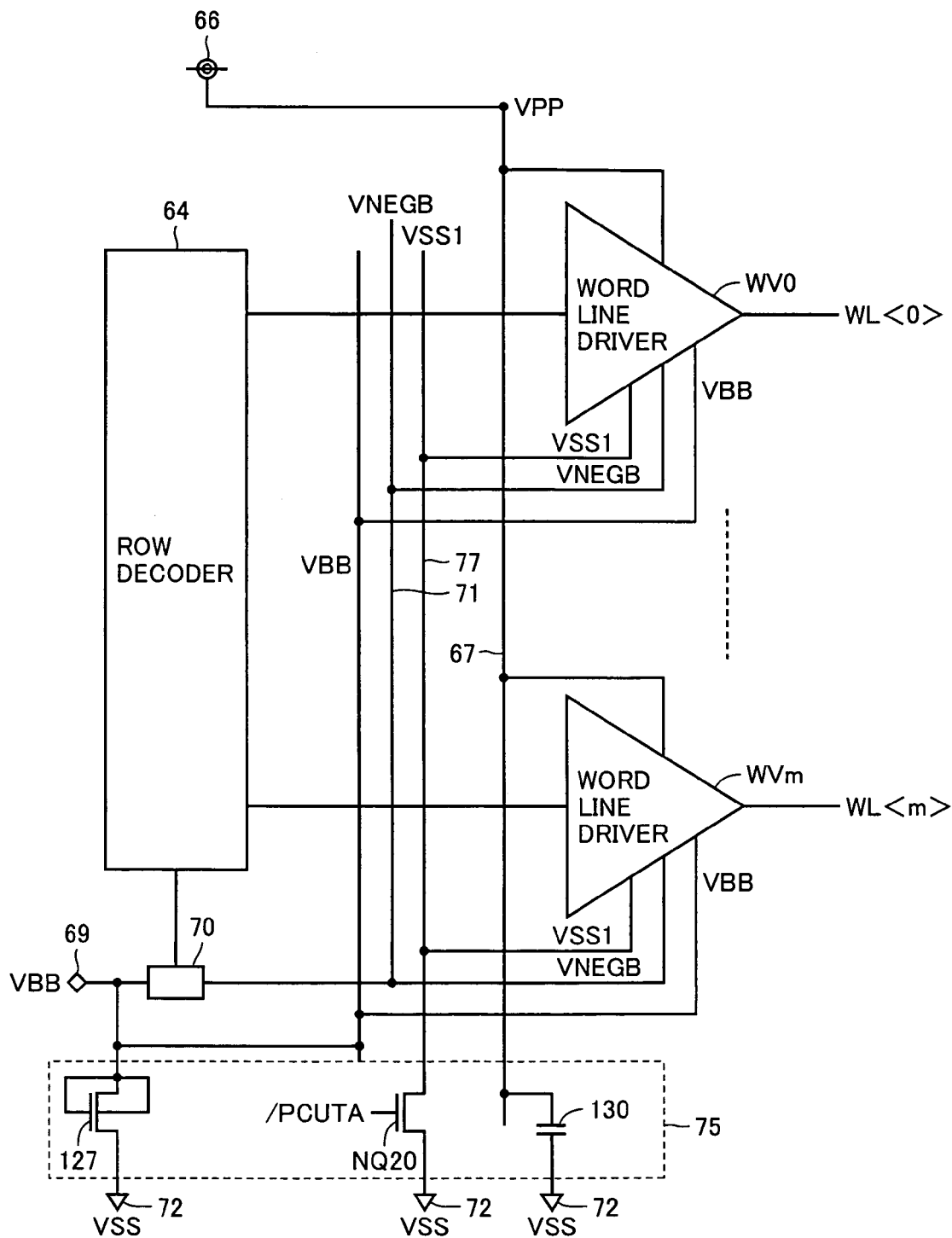
FIG. 26 schematically shows a configuration of a main portion of a semiconductor memory device according to a third embodiment of the present invention.

FIG. 26 shows a configuration of high-voltage power supply control circuit 75 included in drive power supply control circuit 27 according to the third embodiment of the present invention. In high-voltage power supply control circuit 75 shown in FIG. 26, a decoupling capacitance 130 is provided for local high voltage line 67. In addition, in high-voltage power supply control circuit 75, as in the configuration of the low-side power supply control portion in the previous second embodiment, MOS transistor NQ20 for isolating the ground line and MOS transistor 127 for clamping the global negative voltage are provided. Local high voltage line 67 is coupled to the global high voltage line (66) through the high voltage node.

The configuration of the word line driver and negative voltage setting circuit 70 shown in FIG. 26 is the same as that shown in the previous first and second embodiments, and arrangement of local high voltage line 67, local ground line 77 and local negative voltage line 71 is also the same as in the previous first and second embodiments. Therefore, the corresponding portions have the same reference characters allotted and detailed description thereof is not provided.

In high-voltage power supply control circuit 75 shown in FIG. 26, decoupling capacitance 130 is provided for local high voltage line 67. Therefore, even when supply of high voltage VPP is stopped during the stand-by cycle in the stand-by mode, voltage lowering on local high voltage line 67 can sufficiently be suppressed by electric charges accumulated in decoupling capacitance 130. In addition, here, local ground line 77 is isolated from global ground line 72 by MOS transistor NQ20. Therefore, the electric charge leakage path in the word line is cut off and flow out of electric charges charged on the word line can sufficiently be suppressed.

FIG. 26 shows that decoupling capacitance 130 is provided corresponding to each sub block. Decoupling capacitance 130, however, may be provided in global high voltage line 66 in common to a plurality of sub blocks.

The operation timing and the configuration of the control portion in the third embodiment are the same as in the second embodiment, and detailed description thereof is not provided. Therefore, the effect the same as in the second embodiment can also be obtained in the third embodiment. It is noted that power supply cut-off instruction signal /PCUT may be used as in the first embodiment, instead of power supply cut-off instruction signal /PCUTA.

Fourth Embodiment

Figure 27:
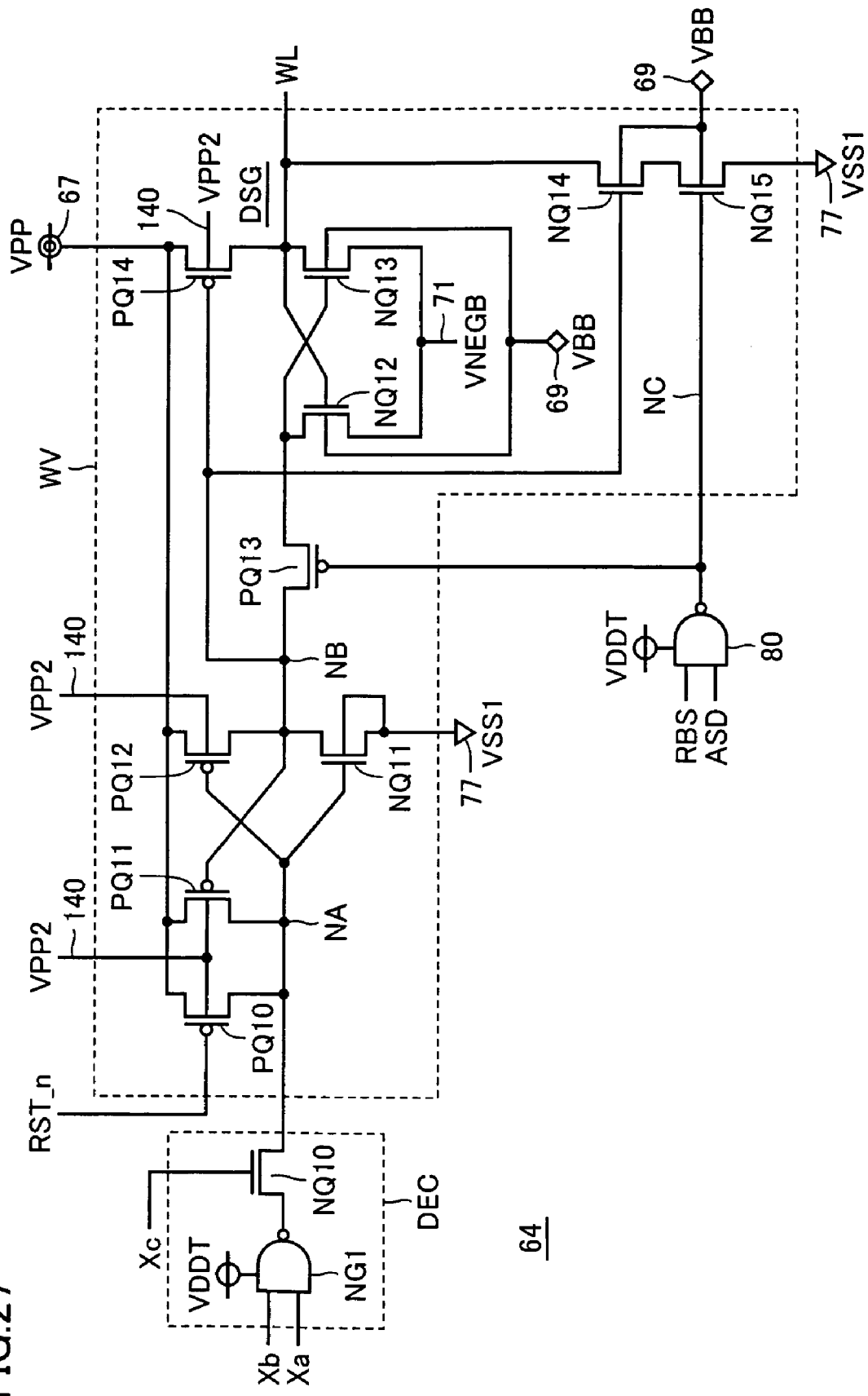
FIG. 27 shows a configuration of a word line driver of a semiconductor memory device according to a fourth embodiment of the present invention.

FIG. 27 shows a configuration of the word line driver according to the fourth embodiment of the present invention. The word line driver shown in FIG. 27 is different from the word line driver shown in FIG. 10 in the configuration in the follow point. A high voltage VPP2 is supplied from a sub local high voltage line (third voltage line) 140 to the backgates of MOS transistors PQ10, PQ11, PQ12, and PQ14. Sub local high voltage line 140 is provided separately from local high voltage line 67. The configuration of the word line driver shown in FIG. 27 is otherwise the same as that of the word line driver shown in FIG. 10. Therefore, the corresponding portions have the same reference characters allotted and detailed description thereof will not be repeated.

In the configuration including the word line driver shown in FIG. 12 as well, the back-gates of P-channel MOS transistors PQ10 to PQ12 and PQ14 are supplied with high voltage VPP2 through sub local high voltage line 140. The back-gate of P-channel MOS transistor PQ13 may be connected to node NB, or may be connected to sub local high voltage line 140.

Figure 28:
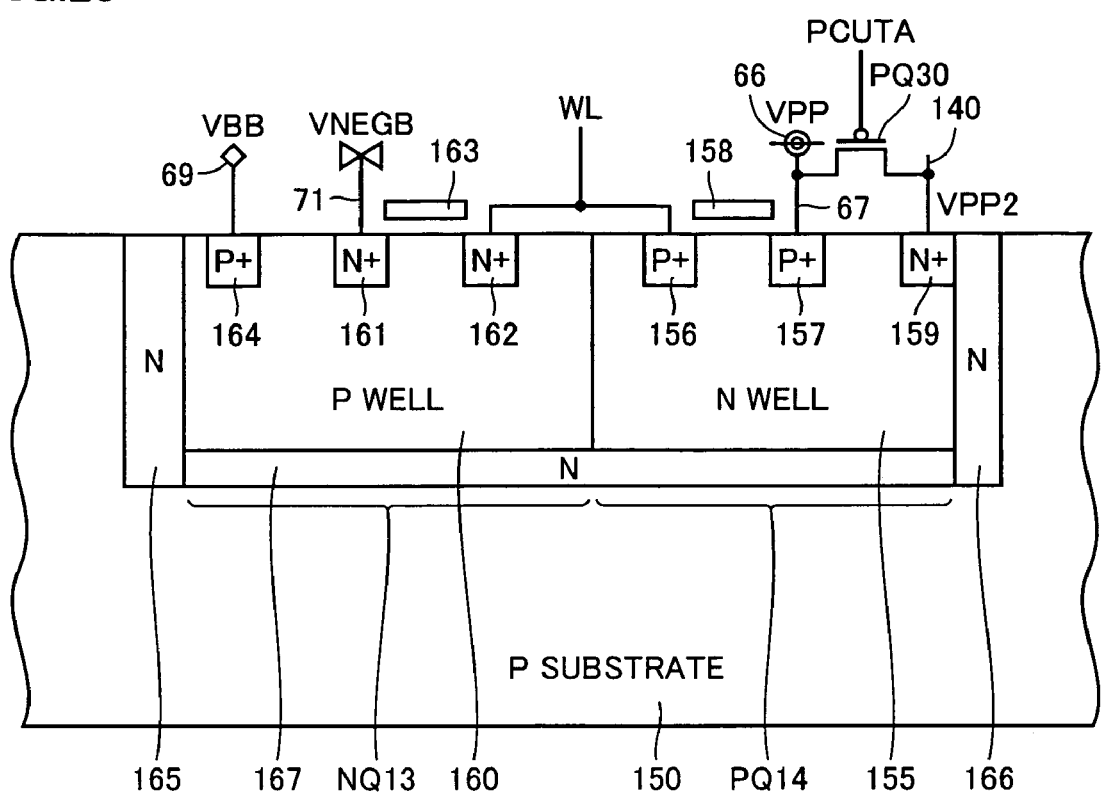
FIG. 28 schematically shows a cross-sectional structure of a transistor in a drive stage of the word line driver shown in FIG. 27.

FIG. 28 schematically shows a cross-sectional structure of P-channel MOS transistor PQ12 and N-channel MOS transistor NQ13 in the word line driver shown in FIG. 27. P-channel MOS transistors PQ10 to PQ12 each have the same cross-sectional structure as that of MOS transistor PQ14 and N-channel MOS transistors NQ11 to NQ15 each have the same cross-sectional structure as that of MOS transistor NQ13 shown in FIG. 26. It is noted, however, that an applied voltage is different depending of a position of arrangement of these transistors.

In FIG. 28, P-channel MOS transistor PQ14 is formed in an N well 155 and N-channel MOS transistor NQ13 is formed in a P well 160. MOS transistor PQ14 includes P-type impurity regions 156 and 157 formed, at the surface of N well 155, spaced apart from each other and a gate electrode 158 formed above the surface of a channel forming region between these impurity regions 156 and 157 with a not-shown gate insulating film interposed.

N well 155 is coupled to sub local high voltage line 140 through an N-type impurity region 159 and receives high voltage VPP2. Impurity region 157 receives high voltage VPP from global high voltage line 66 through local high voltage line 67. A P-channel MOS transistor PQ30 receiving power supply cut-off instruction signal PCUTA at the gate is provided between local high voltage line 67 and sub local high voltage line 140.

N-channel MOS transistor NQ13 includes N-type impurity regions 161 and 162 formed, at the surface of P well 160, spaced apart from each other and a gate electrode 163 formed above the surface of a channel forming region between these impurity regions 161 and 162 with a not-shown gate insulating film interposed. P well 160 is coupled to global negative voltage line 69 through a P-type impurity region 164. Impurity region 161 is coupled to local negative voltage line 71 and receives negative voltage VNEGB. Impurity regions 156 and 162 are commonly coupled to word line WL.

A side N well 166 is provided on a sidewall of N well 155 and a side N well 165 is provided on a sidewall of P well 160. A bottom N well 167 is provided under P well 160 and N well 155. Thus, P well 160 is isolated from P-type substrate 150 and is also isolated from other well regions.

N well 155 is electrically isolated from P-type substrate 150 by side N well 166 and bottom N well 167 (due to PN junction). Normally, P-type substrate 150 is biased to the ground voltage level.

Further, global high voltage line 66 is electrically isolated from N well 155 (the PN junction between P-type impurity region 157 and N well 155 is in a non-conductive state due to the built-in voltage of the PN junction).

In N-channel MOS transistor NQ13, impurity region 161 is coupled to local negative voltage line 71 and impurity region 164 is coupled to global negative voltage line 69. Therefore, P well 160 is biased to negative voltage VBB received from global negative voltage line 69. As the potential of P well 160 is lower than the voltage level of bottom N well 167, the PN junction between P well 160 and bottom N well 167 is in a reverse-biased state, and substantially no leakage current flows from global negative voltage line 69 to P-type substrate 150.

Figure 29:
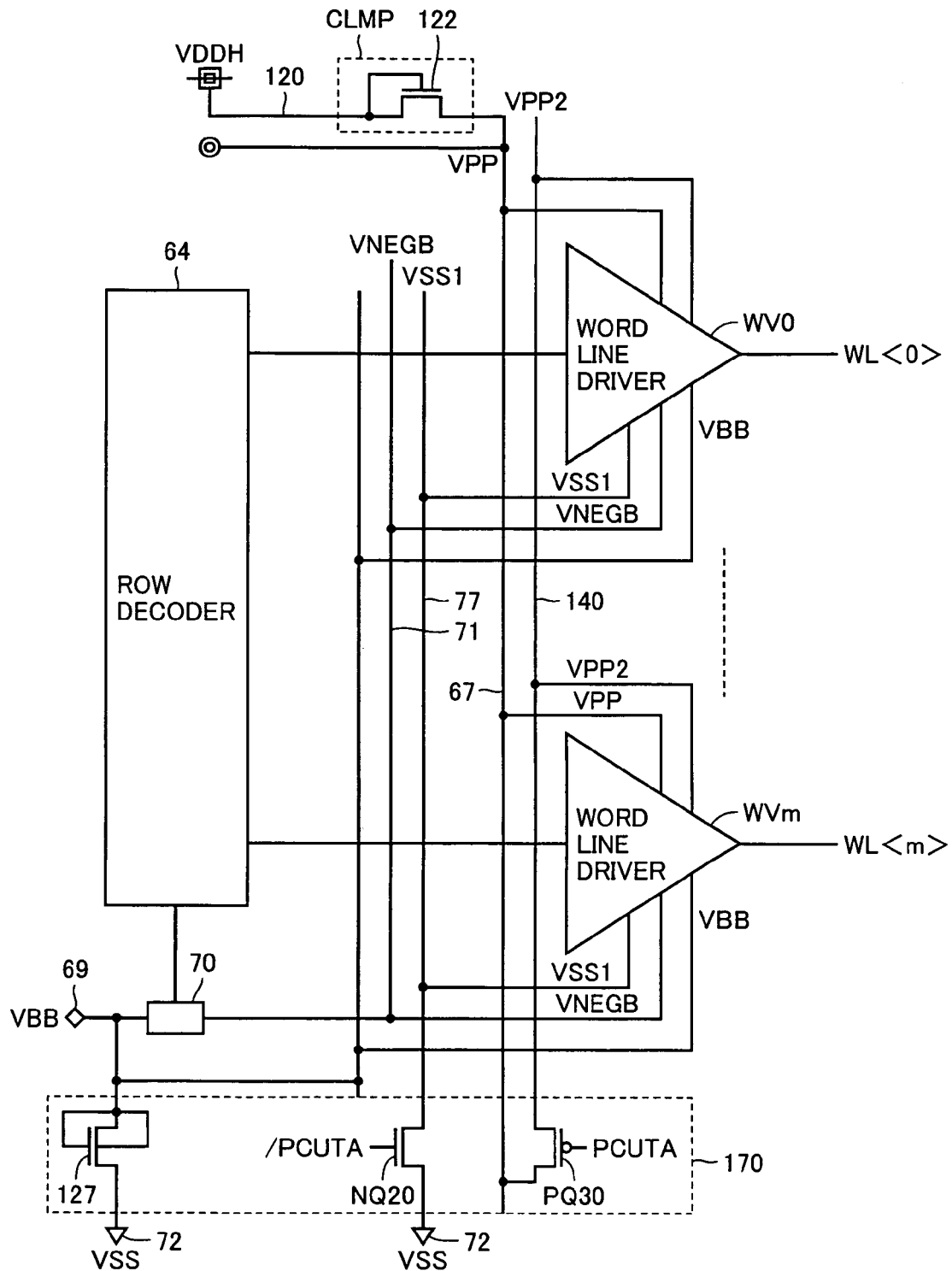
FIG. 29 schematically shows a configuration of a voltage control portion of the semiconductor memory device according to the fourth embodiment of the present invention.

FIG. 29 schematically shows the configuration of the high-voltage power supply control circuit in one sub block according to the fourth embodiment of the present invention. In the high-voltage power supply control circuit, the high-side power supply control circuit is configured with clamping element CLMP as in the second embodiment. Clamping element CLMP is formed of diode-connected N-channel MOS transistor 122 transmitting high-side power supply voltage VDDH supplied to high-side power supply line 120 to local high voltage line 67.

A low-side power supply control circuit 170 includes P-channel MOS transistor PQ30 shown in FIG. 28, in addition to MOS transistor NQ20 for isolating the ground line and MOS transistor 127 for clamping the negative voltage as in the second embodiment.

When power supply is stopped during the stand-by state in the stand-by mode in the low power consumption mode (deep power down mode), power supply cut-off instruction signal PCUTA is set to H level and MOS transistor PQ30 is set to the OFF state. In response, sub local high voltage line 140 and local high voltage line 67 are electrically isolated from each other.

Local high voltage line 67 transmits high voltage VPP to word lines WL<0> to WL<m> through word line drivers WV0 to WVm. On the other hand, as shown in FIG. 28, high voltage VPP2 on sub local high voltage line 140 is transmitted to N well (backgate) 155 where the P-channel MOS transistor is formed. Therefore, during the stand-by state, even if high voltage VPP2 on sub local high voltage line 140 is consumed by the leakage current from N well 155 to P-type substrate 150, high voltage VPP on local high voltage line 67 is not consumed.

In this state, as in the second embodiment, local ground line 77 is isolated from global ground line 72 by MOS transistor NQ20, and local negative voltage line 71 is isolated from global negative voltage line 69 by negative voltage setting circuit 70. Therefore, there is substantially no leakage path for high voltage VPP of local high voltage line 67, and word lines WL<0> to WL<m> can be maintained substantially at the high voltage VPP level.

In addition, even if the voltage level of local high voltage line 67 is lowered, voltage lowering in high voltage VPP can be compensated for by external power supply voltage VDDH through clamping element CLMP, and the voltage level of word lines WL<0> to WL<m> in the non-selected state can be maintained substantially at the high voltage VPP level. Thus, data can be held in a stable manner without shortening the refresh cycle and current consumption can reliably be reduced.

It is noted that power supply cut-off instruction signals PCUTA and /PCUTA are control signals complementary to each other, and power supply connection control can be carried out by utilizing the configuration of the control portion shown in the second embodiment.

In the fourth embodiment of the present invention, clamping element CLMP is provided for local high voltage line 67. It is not particularly necessary, however, to provide clamping element CLMP. In addition, a decoupling capacitance may be connected to local high voltage line 67 and to sub local high voltage line 140, so that voltage lowering in local high voltage line 67 and sub local high voltage line 140 can be suppressed.

As described above, according to the fourth embodiment of the present invention, a voltage line supplying a backgate bias for the transistors in the word line driver and a voltage line transmitting the high voltage to the word line are separately provided. Therefore, even if the back gate bias voltage is lowered due to the leakage current in the reverse direction from the well region to the substrate during stand-by, leakage of electric charges from the voltage line transmitting the high voltage to the word line does not occur and lowering of the word line voltage can be suppressed. In addition, the effect in the second and third embodiments can also be obtained.

Fifth Embodiment

Figure 30:
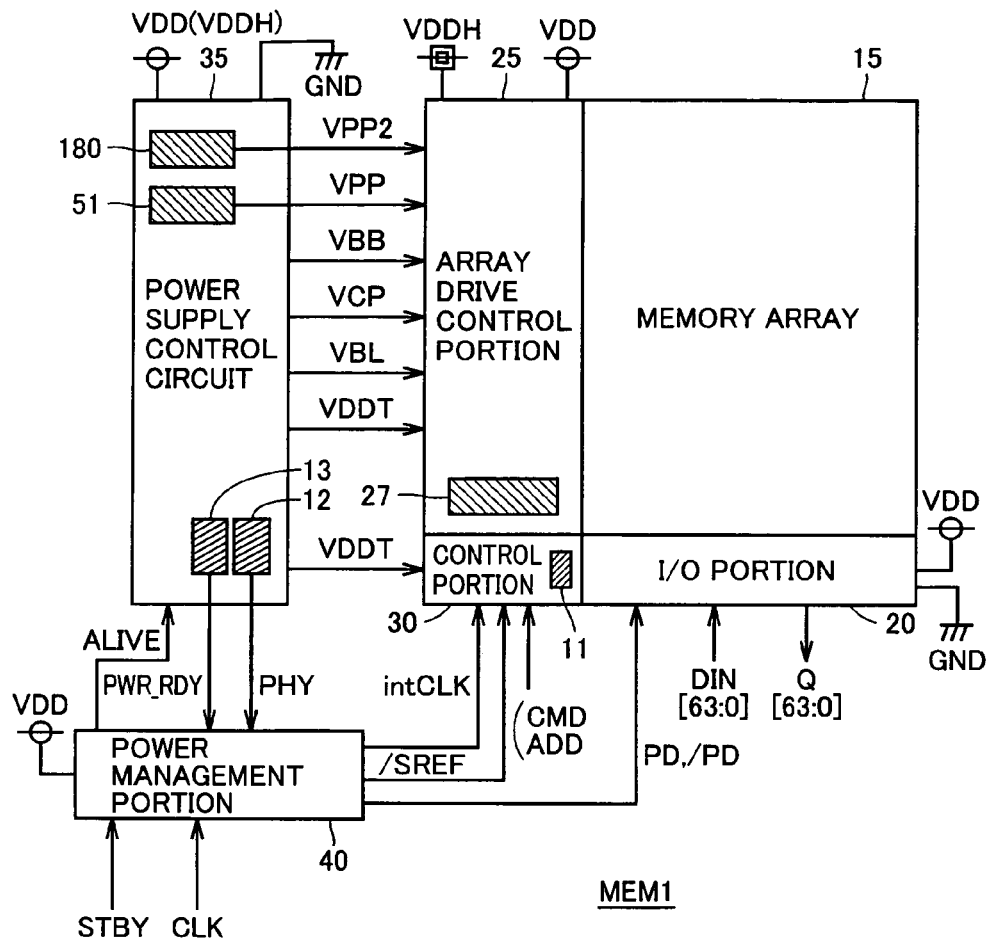
FIG. 30 schematically shows an overall configuration of a semiconductor memory device according to a fifth embodiment of the present invention.

FIG. 30 schematically shows an overall configuration of the memory circuit (DRAM core) according to the fifth embodiment of the present invention. The memory circuit shown in FIG. 30 is different from the memory circuit shown in FIG. 21 in the configuration in the following point. Specifically, VPP generation circuit 51 for generating high voltage VPP and a high voltage generation circuit 180 for generating high voltage VPP2 are separately provided in power supply control circuit 35. These high voltages VPP and VPP2 are set to the same voltage level. The configuration of the DRAM core shown in FIG. 30 is otherwise the same as that of the memory circuit (DRAM core) shown in FIG. 21. Therefore, the corresponding portions have the same reference characters allotted and detailed description thereof will not be repeated.

Figure 31:
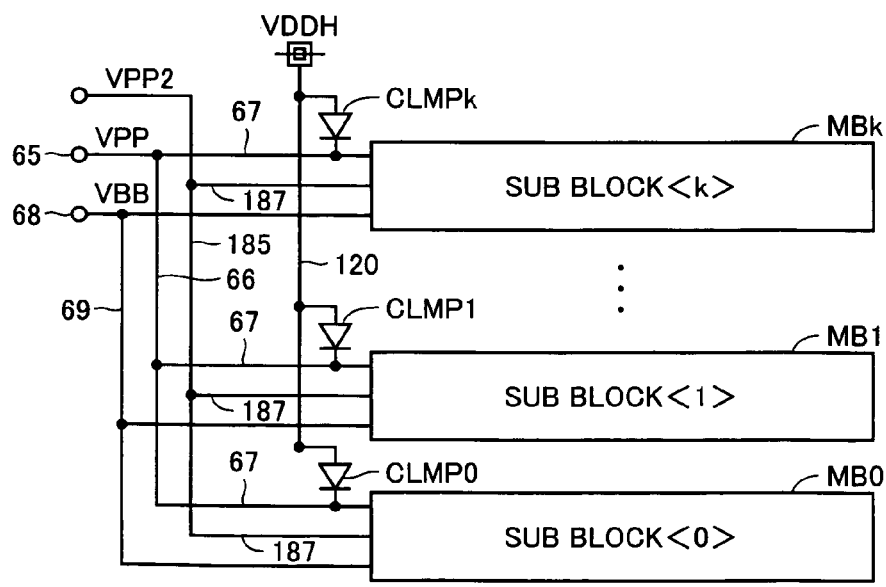
FIG. 31 schematically shows a configuration of a main portion of the semiconductor memory device according to the fifth embodiment of the present invention.

FIG. 31 schematically shows a manner of distribution of high voltages VPP and VPP2 in array drive control portion 25. In FIG. 31, high voltage VPP2 from high voltage generation circuit 180 is commonly transmitted to sub blocks MB0 to MBk through a second global high voltage line 185. Second global high voltage line 185 is coupled to an output portion of high voltage generation circuit 180. High voltage VPP2 is transmitted to sub blocks MB0 to MBk through second local high voltage lines 187, respectively.

High voltage VPP from VPP generation circuit 51 is transmitted to each of sub blocks MB0 to MBk through global high voltage line 66 and local high voltage line 67. The manner of distribution of the voltages in the array drive control portion shown in FIG. 31 is otherwise the same as that in a voltage distribution system shown in FIG. 22. Therefore, the corresponding portions have the same reference characters allotted and detailed description thereof will not be repeated.

Figure 32:
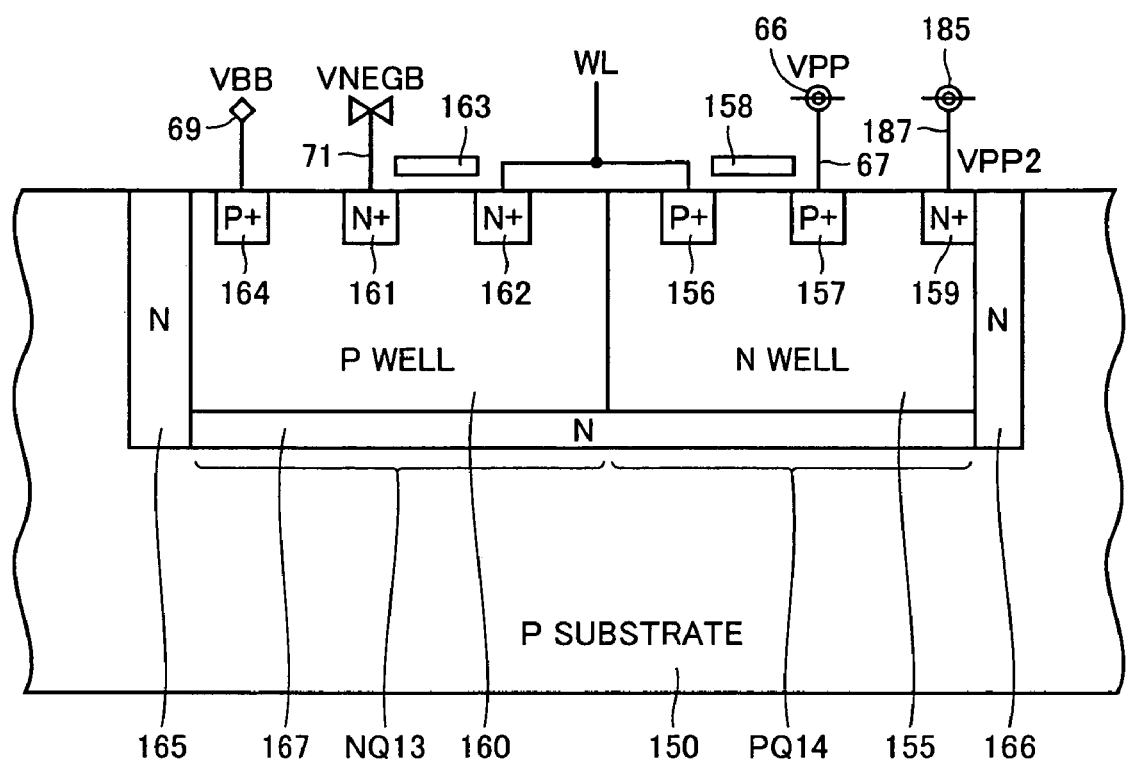
FIG. 32 schematically shows a cross-sectional structure of a transistor of a word line driver in the fifth embodiment of the present invention.

FIG. 32 schematically shows a cross-sectional structure of transistors in a word line drive stage in word line driver WV. The cross-sectional structure of the transistors in the drive stage shown in FIG. 32 is the same as the cross-sectional structure of the transistors in the drive stage shown in FIG. 28. In the configuration shown in FIG. 32, high voltage VPP from global high voltage line 66 is supplied to impurity region 157 through local high voltage line 67. High voltage VPP2 from second local high voltage line 187 and second global high voltage line 185 is supplied to N well 155 through impurity region 159. The power supplying path of transmitting non-selection voltage VPP to word lines WL and the power supplying path of generating high voltage VPP2 biasing the backgate (N well 155) of the P-channel MOS transistor are separately provided. The configuration of the word line drive transistors shown in FIG. 32 is otherwise the same as in the cross-sectional structure of the transistor shown in FIG. 28. Therefore, the corresponding portions have the same reference characters allotted and detailed description thereof will not be repeated.

Figure 33:
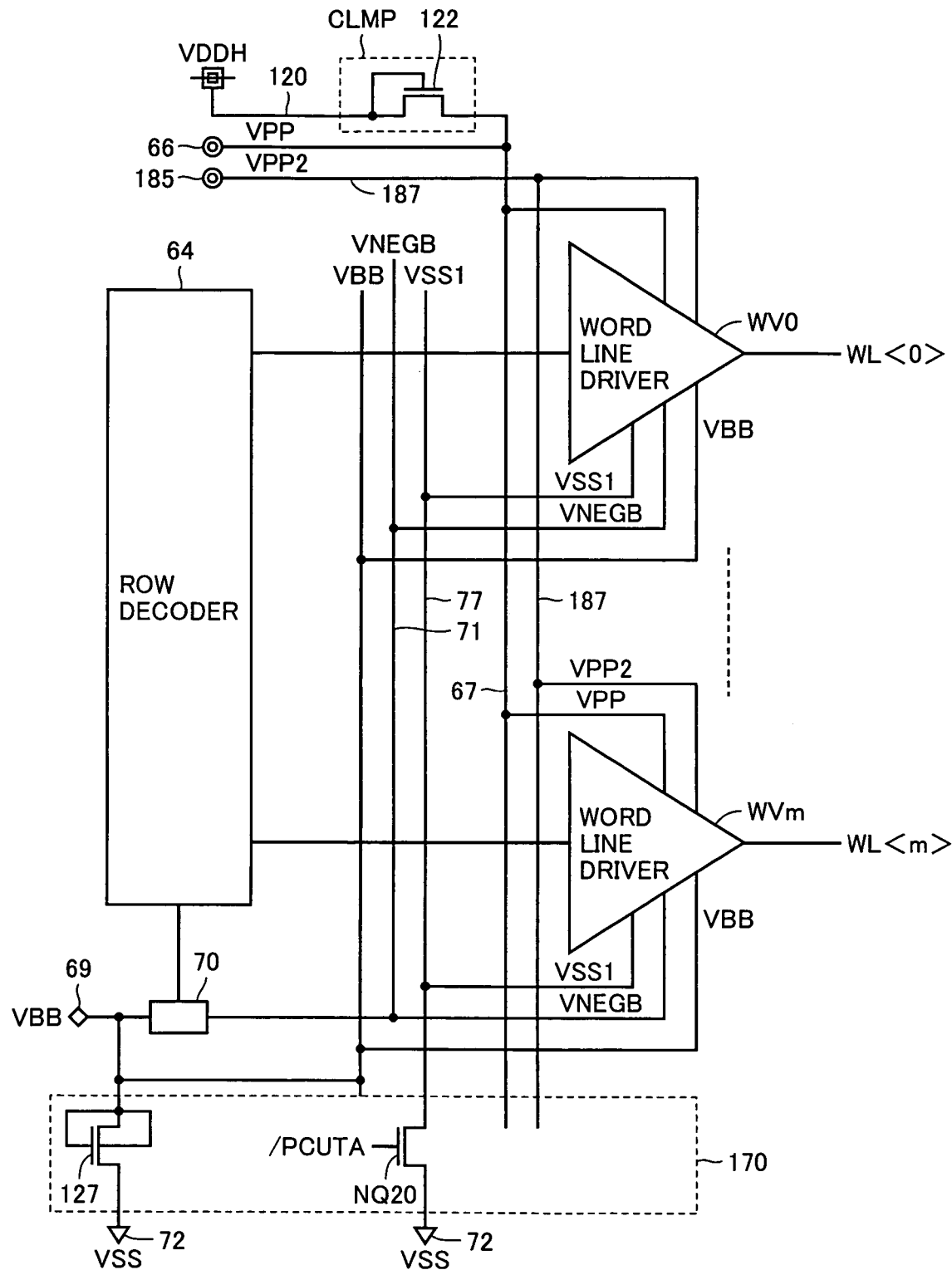
FIG. 33 schematically shows a configuration of a voltage control portion of the semiconductor memory device according to the fifth embodiment of the present invention.

FIG. 33 schematically shows a configuration of an array drive portion in one sub block in the fifth embodiment of the present invention. The configuration of the array drive control portion shown in FIG. 33 is different from the configuration of the array drive control portion shown in FIG. 29 in the following point. Specifically, local high voltage line 67 and second local high voltage line 187 transmitting high voltage VPP2 are separately provided. P-channel MOS transistor PQ30 for equalization shown in FIG. 29 is not provided. Second local high voltage line 187 transmits high voltage VPP2 to the backgate of the P-channel MOS transistors in word line drivers WV0 to WVm. The configuration of the array drive control portion shown in FIG. 33 is otherwise the same as that of the array drive control portion shown in FIG. 29. Therefore, the corresponding portions have the same reference characters allotted and detailed description thereof will not be repeated. In addition, the operation timing is also the same as in the timing chart shown in FIG. 24, and the control manner is the same as in the second and third embodiments. Further, the configuration of the control portion shown in the second embodiment can be employed for the configuration of the control portion.

Therefore, when the low current consumption stand-by mode (deep power down mode) is designated in the fifth embodiment of the present invention, during the stand-by cycle, local ground line 77 is isolated from global ground line 72 by MOS transistor NQ20. In addition, local negative voltage line 71 is isolated from global negative voltage line 69 by negative voltage setting circuit 70. During the stand-by state, even when the current flows from N well 155 to P-type substrate 150 due to the leakage current in the reverse direction in word line drivers WV0 to WVm and the voltage level of biasing high voltage VPP2 is lowered, local high voltage line 67 is not used for charging the back gate (N well 155). Therefore, word line WL can hold a voltage at a value close to the high voltage VPP level. Thus, even if supply of the internal power supply voltage is cut off during the stand-by cycle, the memory cell data can be held, and therefore, it is not required to shorten the refresh time period.

In addition, it is not necessary to carry out connection control of the high voltage line and current consumption required in such connection control can be reduced.

It is noted that clamping element CLMP may not be provided in the configuration shown in FIG. 33. In addition, as in the third embodiment, a decoupling capacitance may be connected to VPP and VPP2 local high voltage lines, so that lowering in high voltages VPP and VPP2 in the stand-by state can further be suppressed and the memory cell transistor can reliably be maintained in the OFF state.

As described above, according to the fifth embodiment of the present invention, a high voltage generation circuit for biasing the backgate of the MOS transistors and a high voltage generation circuit generating a word line non-selected voltage are separately provided. Therefore, even when the leakage current is generated in a backgate region, the word line non-selected voltage is not affected by the leakage current and a desired voltage level can be maintained.

By applying the present invention to a DRAM mounted on a common semiconductor chip together with a logic such as a processor, an embedded DRAM capable of holding data in a stable manner with low power consumption can be achieved.

The semiconductor memory device according to the present invention, however, is also applicable to a memory alone, as far as a P-channel MOS transistor is employed as a memory cell transistor and a word line is maintained at a high voltage level in a non-selected state.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor memory device, comprising:
   a plurality of sub blocks each having a plurality of memory cells arranged in rows and columns, each memory cell having storage data required for refresh;
   a power supply circuit for generating at least first and second voltages when activated, and stopping generation of the first and second voltages during a stand-by state subsequent to completion of burst refresh successively performed on said plurality of memory cells for holding the data of the memory cells, in a stand-by mode in which the storage data are held;
   a first global voltage line for commonly transmitting the first voltage from said power supply circuit to said plurality of sub blocks;

a plurality of first local voltage lines, arranged corresponding to said plurality of sub blocks and coupled to said first global voltage line, each for receiving the voltage from said first global voltage line and transmitting the received voltage to a corresponding sub block;

a second global voltage line for commonly transmitting the second voltage from said power supply circuit to said plurality of sub blocks;

a plurality of second local voltage lines provided corresponding to the respective sub blocks;

a plurality of voltage setting circuits, arranged corresponding to the respective sub blocks, each for setting a voltage of the second local voltage line arranged in a corresponding sub block to a voltage level corresponding to the second voltage on said second global voltage line selectively in accordance with a sub block selection signal;

a global reference voltage line for commonly transmitting a fixed voltage to said plurality of sub blocks;

a plurality of local reference voltage lines arranged corresponding to the respective sub blocks;

a plurality of word lines, arranged corresponding to memory cell rows, each connected to the memory cells in a corresponding row in each sub block;

a plurality of word line control circuits, arranged corresponding to the respective sub blocks, each including a plurality of word line drivers arranged corresponding to the respective memory cell rows in a corresponding sub block and driving the memory cells in corresponding rows to a selected state in accordance with a row selection signal, each word line driver including a pre-drive stage for generating a signal changing between a voltage on the local reference voltage line and a voltage on a corresponding first local voltage line in accordance with said row selection signal and a drive stage for setting a corresponding word line to a voltage level of one of the voltage on said corresponding first local voltage line and the voltage on a corresponding second local voltage line in accordance with an output signal from said pre-drive stage; and drive power supply control circuitry including a connection control circuit for isolating at least said global reference voltage line and said local reference voltage line from each other while connecting said first global voltage line and said first local voltage line to each other during the stand-by state in said stand-by mode, for suppressing voltage variation on said first local voltage line during said stand-by state.

2. The semiconductor memory device according to claim 1, wherein said drive power supply control circuitry includes a gate circuit for electrically connecting said first local voltage line with said local reference voltage line and said second local voltage line so as to set the voltage of said local reference voltage line and said second local voltage line to said first voltage level for a time period shorter than said stand-by state, further upon transition from a cycle of the burst refresh to said stand-by state further in said stand-by state.

3. The semiconductor memory device according to claim 1, wherein said drive power supply control circuit further includes a first clamping element coupled to a voltage source supplying a third voltage and suppressing variation in voltage of said plurality of first local voltage lines beyond a voltage level defined depending on the third voltage of said third voltage source, and a second clamping element coupled to said second global voltage line, for suppressing variation in voltage of said second global voltage line beyond a voltage level defined by the fixed voltage of said global reference voltage line.

4. The semiconductor memory device according to claim 1, wherein said drive power supply control circuit further includes a clamping element coupled to said global voltage line and suppressing variation in voltage of said second global voltage line beyond a voltage level defined by the fixed voltage of said global reference voltage line, and a decoupling capacitance element coupled to each first local voltage line and suppressing variation of the voltage of said each first local voltage line.

5. The semiconductor memory device according to claim 1, further comprising a plurality of third local voltage lines arranged corresponding to the respective sub blocks, wherein said drive stage of each word line driver includes a first insulated gate type field effect transistor receiving a voltage of a corresponding third local voltage line at a backgate and transmitting the voltage of the corresponding first local voltage line to the corresponding word line when made conductive, and a second insulated gate type field effect transistor receiving the voltage of said second global voltage line at a backgate, and rendered conductive complementarily to said first insulated gate type field effect transistor, for transmitting the voltage of the corresponding second local voltage line to said corresponding word line when made conductive, and said drive power supply control circuit further includes an isolation gate provided for each sub block, for isolating the first local voltage line and the third local voltage line from each other in said stand-by cycle in said each sub block, and a clamping element for suppressing variation in voltage of said second global voltage line beyond a voltage level defined by the fixed voltage of said global reference voltage line.

6. The semiconductor memory device according to claim 5, further comprising a second clamping element coupled to each first local voltage line, for suppressing variation in voltage of the first local voltage line beyond a voltage level defined by an externally supplied fourth voltage.

7. The semiconductor memory device according to claim 1, wherein said power supply circuit includes:

a first voltage generation circuit for generating said first voltage; and a second voltage generation circuit provided separately from said first voltage generation circuit and generating a third voltage same in voltage level as said first voltage, and said semiconductor memory device further comprises:

a third global voltage line for commonly transmitting the third voltage from said power supply circuit to each sub block; and a plurality of third local voltage lines provided separately from the first local voltage lines and corresponding to the respective sub blocks, for transmitting a voltage on said third global voltage line to a corresponding sub block, and said drive stage of each word line driver includes a first insulated gate type field effect transistor receiving the voltage of a corresponding third local voltage line at a backgate and transmitting the voltage of the corresponding first local voltage line to the corresponding word line when rendered conductive, and a second insulated gate type field effect transistor receiving the voltage of said second global voltage line at a backgate, and rendered conductive complementarily to said first insulated gate type field effect transistor for transmitting the voltage of the corresponding second local voltage line to the corresponding word line when rendered conductive, and said drive power supply control circuit further includes a clamping element for suppressing variation in voltage of said second global voltage line beyond a voltage level defined by the fixed voltage of said global reference voltage line.

8. The semiconductor memory device according to claim 7, further comprising a second clamping element for suppressing variation in voltage of each first local voltage line beyond a voltage level defined by an externally supplied fourth voltage.

* * * * *